(12) United States Patent
Makala et al.

(10) Patent No.: US 10,438,964 B2
(45) Date of Patent: Oct. 8, 2019

(54) THREE-DIMENSIONAL MEMORY DEVICE HAVING DIRECT SOURCE CONTACT AND METAL OXIDE BLOCKING DIELECTRIC AND METHOD OF MAKING THEREOF

(71) Applicant: SANDISK TECHNOLOGIES LLC, Plano, TX (US)

(72) Inventors: Raghuveer S. Makala, Campbell, CA (US); Senaka Krishna Kanakamedala, San Jose, CA (US); Yanli Zhang, San Jose, CA (US); Yao-Sheng Lee, Tampa, FL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 130 days.

(21) Appl. No.: 15/633,131

(22) Filed: Jun. 26, 2017

(65) Prior Publication Data
US 2018/0374866 A1    Dec. 27, 2018

(51) Int. Cl.
*H01L 27/115* (2017.01)
*H01L 27/11582* (2017.01)
(Continued)

(52) U.S. Cl.
CPC .. *H01L 27/11582* (2013.01); *H01L 21/28282* (2013.01); *H01L 21/31122* (2013.01);
(Continued)

(58) Field of Classification Search
None
See application file for complete search history.

(56) References Cited

U.S. PATENT DOCUMENTS 5,084,417 A    1/1992    Joshi et al.
5,807,788 A    9/1998    Brodsky et al.
(Continued)

FOREIGN PATENT DOCUMENTS

| JP | 2015149413 A | 8/2015 |
| WO | WO2002/015277 A2 | 2/2002 |
| WO | WO2012/003301 A2 | 1/2012 |

OTHER PUBLICATIONS

International Search Report and Written Opinion of the International Searching Authority for International Patent Application No. PCT/US2018/020126, dated May 28, 2018, 18 pages.
(Continued)

*Primary Examiner* — Ali Naraghi
(74) *Attorney, Agent, or Firm* — The Marbury Law Group PLLC

(57) ABSTRACT

A strap level sacrificial layer and an alternating stack of insulating layers and spacer material layers are formed over a substrate. An array of memory stack structures is formed through the alternating stack and the strap level sacrificial layer. Each memory film in the memory stack structures includes a metal oxide blocking dielectric. After formation of a source cavity by removal of the strap level sacrificial layer, an atomic layer etch process can be employed to remove portions of the metal oxide blocking dielectrics at the level of the source cavity. Outer sidewalls of semiconductor channels in the memory stack structures are exposed by additional etch processes, and a source strap layer is selectively deposited in the source cavity in contact with the semiconductor channel. If the spacer material layers are sacrificial material layers, all volumes of the sacrificial material layers can be replaced with the electrically conductive layers.

7 Claims, 23 Drawing Sheets

(51) Int. Cl.
| | |
|---|---|
| *H01L 29/51* | (2006.01) |
| *H01L 29/423* | (2006.01) |
| *H01L 27/11575* | (2017.01) |
| *H01L 27/11565* | (2017.01) |
| *H01L 29/08* | (2006.01) |
| *H01L 21/28* | (2006.01) |
| *H01L 21/311* | (2006.01) |

(52) U.S. Cl.
CPC .. *H01L 27/11565* (2013.01); *H01L 27/11575* (2013.01); *H01L 29/0847* (2013.01); *H01L 29/42364* (2013.01); *H01L 29/513* (2013.01); *H01L 29/517* (2013.01)

(56) References Cited

U.S. PATENT DOCUMENTS

| | | |
|---|---|---|
| 5,915,167 A | 6/1999 | Leedy |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,696,559 B2 | 4/2010 | Arai et al. |
| 7,745,265 B2 | 6/2010 | Mokhlesi et al. |
| 7,745,312 B2 | 6/2010 | Herner et al. |
| 7,799,670 B2 | 9/2010 | Ramkumar et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,309,405 B2 | 11/2012 | Yang et al. |
| 8,349,681 B2 | 1/2013 | Alsmeier et al. |
| 8,394,716 B2 | 3/2013 | Hwang et al. |
| 8,569,827 B2 | 10/2013 | Lee et al. |
| 8,614,126 B1 | 12/2013 | Lee et al. |
| 8,658,499 B2 | 2/2014 | Makala et al. |
| 8,946,023 B2 | 2/2015 | Makala et al. |
| 9,224,752 B1 | 12/2015 | Lee et al. |
| 9,230,979 B1 | 1/2016 | Pachamuthu et al. |
| 9,236,396 B1 | 1/2016 | Koka et al. |
| 9,305,849 B1 | 4/2016 | Tsutsumi et al. |
| 9,305,937 B1 | 4/2016 | Tsutsumi et al. |
| 9,379,132 B2 | 6/2016 | Koka et al. |
| 9,455,263 B2 | 9/2016 | Zhang et al. |
| 9,478,558 B2 | 10/2016 | Koka et al. |
| 9,548,313 B2 | 1/2017 | Yada et al. |
| 9,570,460 B2 | 2/2017 | Kanakamedala et al. |
| 9,613,977 B2 | 4/2017 | Sharangpani et al. |
| 9,659,955 B1 | 5/2017 | Sharangpani et al. |
| 2007/0210338 A1 | 9/2007 | Orlowski |
| 2007/0252201 A1 | 11/2007 | Kito et al. |
| 2009/0230449 A1 | 9/2009 | Sakaguchi et al. |
| 2009/0242967 A1 | 10/2009 | Katsumata et al. |
| 2009/0283819 A1 | 11/2009 | Ishikawa et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0266606 A1 | 11/2011 | Park et al. |
| 2011/0291178 A1 | 12/2011 | Sasaki et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0012920 A1 | 1/2012 | Shin et al. |
| 2012/0119287 A1 | 5/2012 | Park et al. |
| 2012/0146127 A1 | 6/2012 | Lee et al. |
| 2012/0156848 A1 | 6/2012 | Yang et al. |
| 2012/0199897 A1 | 9/2012 | Chang et al. |
| 2012/0256247 A1 | 10/2012 | Alsmeier |
| 2013/0134492 A1 | 5/2013 | Yang et al. |
| 2013/0168757 A1 | 7/2013 | Hong |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2014/0008714 A1 | 1/2014 | Makala et al. |
| 2014/0151774 A1 | 6/2014 | Rhie |
| 2014/0225181 A1 | 8/2014 | Makala et al. |
| 2014/0295636 A1 | 10/2014 | Makala et al. |
| 2015/0008505 A1 | 1/2015 | Chien et al. |
| 2015/0076580 A1 | 3/2015 | Pachamuthu et al. |
| 2015/0076584 A1 | 3/2015 | Pachamuthu et al. |
| 2015/0149413 A1 | 5/2015 | Lee et al. |
| 2015/0162342 A1 | 6/2015 | Lee et al. |
| 2015/0179660 A1 | 6/2015 | Yada et al. |
| 2017/0069653 A1* | 3/2017 | Naito ................ H01L 27/11582 |
| 2017/0148800 A1 | 5/2017 | Nishikawa et al. |
| 2017/0271355 A1* | 9/2017 | Kashima ........... H01L 27/11582 |
| 2018/0122742 A1* | 5/2018 | Ha ........................ H01L 23/535 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

International Application No. PCT/US2016/049986, Invitation to Pay Additional Fees, dated Dec. 22, 2016, 8pgs.

International Application No. PCT/US2016/062528, Invitation to Pay Additional Fees, dated Feb. 3, 2017, 8pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

Jang, et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

Ooshita, J., Toshiba Announces 32Gb 3D-Stacked Multi-Level NAND Flash, 3 pages, http://techon.nikkeibo.co.jp/english/NEWS_EN/20090619/171977/ Nikkei Microdevices, Tech-On, Jun. 19, 2009.

Li et al., "Sacrificial Polymers for Nanofluidic Channels in Biological Applications", Nanotechnology 14 (2003) 578-583.

Invitation to Pay Additional Fees, including Annex to Form PCT/ISA/206 Communication Relating to the Results of the Partial International Search for PCT/US2014/048160, dated Oct. 31, 2014.

Invitation to Pay Additional Fees, including Annex to Form PCT/ISA/206 Communication Relating to the Results of the Partial International Search for PCT/US2014/032123, dated Jul. 15, 2014.

(56) References Cited

OTHER PUBLICATIONS

Kim, S. K. et al., "Low Temperature (<100C) Deposition of Aluminum Oxide Thin Films by ALD with $O_3$ as Oxidant," Journal of the Electrochemical Society, vol. 153, No. 5, pp. F69-F76, (2006).

Pong, R. et al., "A Displacement Reaction Source Demonstrated for Aluminum Implantation and Proposed for Indium Implantation," IEEE Ion Implantation Technology Proceedings, 1998 International Conference, vol. 1, pp. 388-391, (1998).

Grampeix, H. et al., "Effect of Nitridation for High-K Layers by ALCVD™ in Order to Decrease the Trapping in Non Volatile Memories," ECS Transactions, vol. 11, No. 7, pp. 213-225, (2007).

Frank, M. M. et al., "Enhanced Initial Growth of Atomic-Layer-Deposited Metal Oxides on Hydrogen-Terminated Silicon," Applied Physics Letters, vol. 83, No. 4, pp. 740-739, (2003).

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Trowbridge et al., "Enhanced Oxidation of Silicon Nitride Using In Situ Steam Generation," 199th ECS Conf. vol. 2000. 2001.

Lamagna, L et al., "Mechanisms for Substrate-Enhanced Growth during the Early Stages of Atomic Layer Deposition of Alumina onto Silicon Nitride Surfaces," *Chem. Mater.*, vol. 24, No. 6, pp. 1080-1090, (2012).

U.S. Appl. No. 15/017,961, filed Feb. 8, 2016, SanDisk Technologies LLC.

U.S. Appl. No. 15/225,492, filed Aug. 1, 2016, SanDisk Technologies LLC.

U.S. Appl. No. 15/354,116, filed Nov. 17, 2016, SanDisk Technologies LLC.

U.S. Appl. No. 15/458,200, filed Mar. 14, 2017, SanDisk Technologies LLC.

U.S. Appl. No. 15/458,269, filed Mar. 14, 2017, SanDisk Technologies LLC.

U.S. Appl. No. 15/458,272, filed Mar. 14, 2017, SanDisk Technologies LLC.

U.S. Appl. No. 15/626,444, filed Jun. 19, 2017, SanDisk Technologies LLC.

George, SM, et al., "Prospects for Thermal Atomic Layer Etching Using Sequential, Self-Limiting Fluorination and Ligand-Exchange Reactions." ACS Nano. May 24, 2016; vol. 10, No. 5, pp. 4889-4894.

Lee, Y. et al., "Trimethylaluminum as the Metal Precursor for the Atomic Layer Etching of Al2O3 Using Sequential, Self-Limiting Thermal Reactions," Chem. Mater., 2016, vol. 28, No. 9, pp. 2994-3003.

* cited by examiner

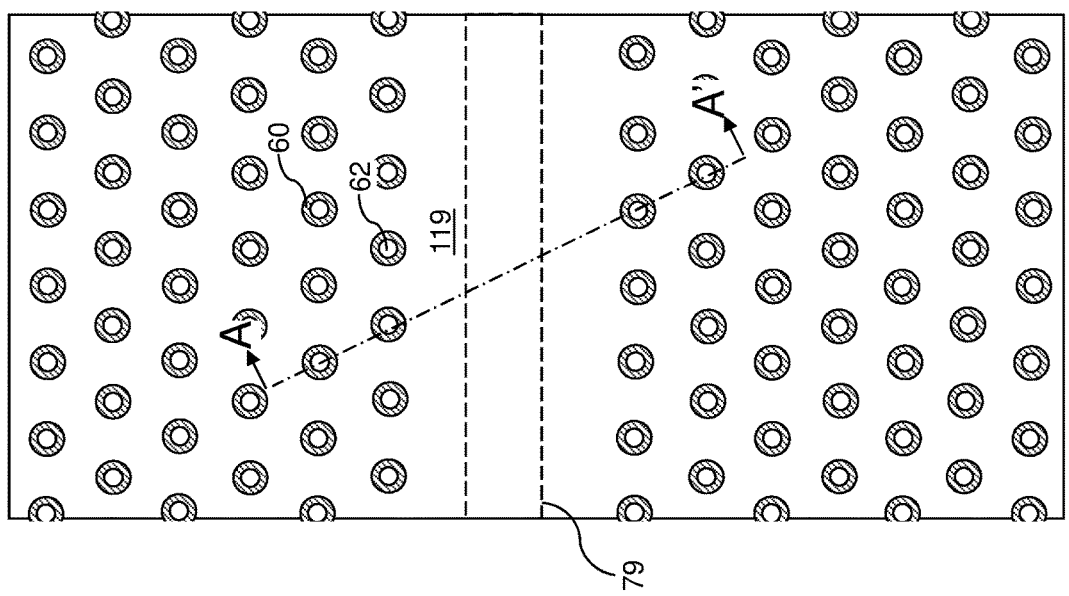

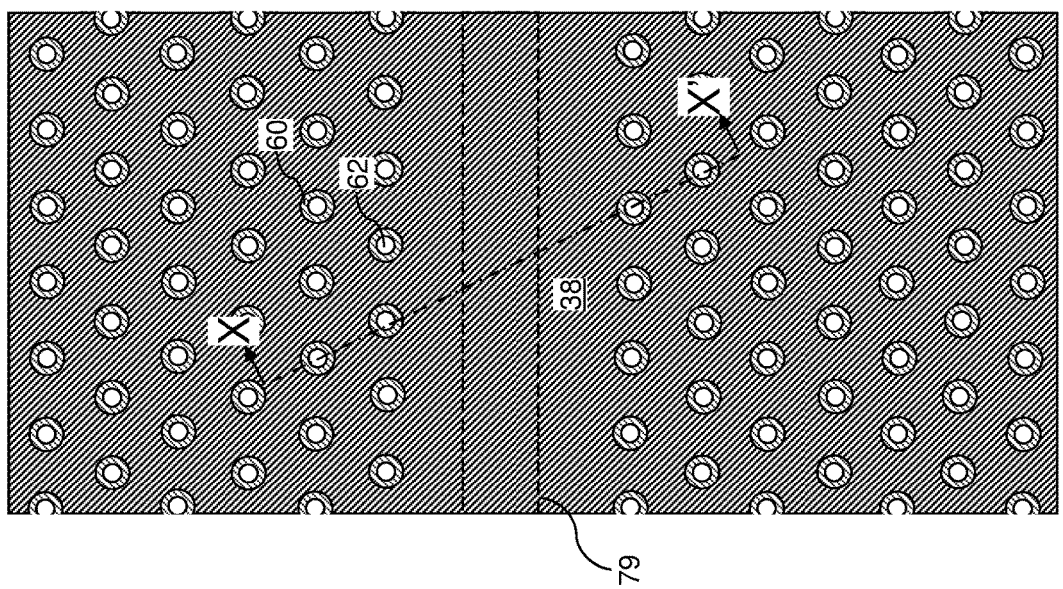

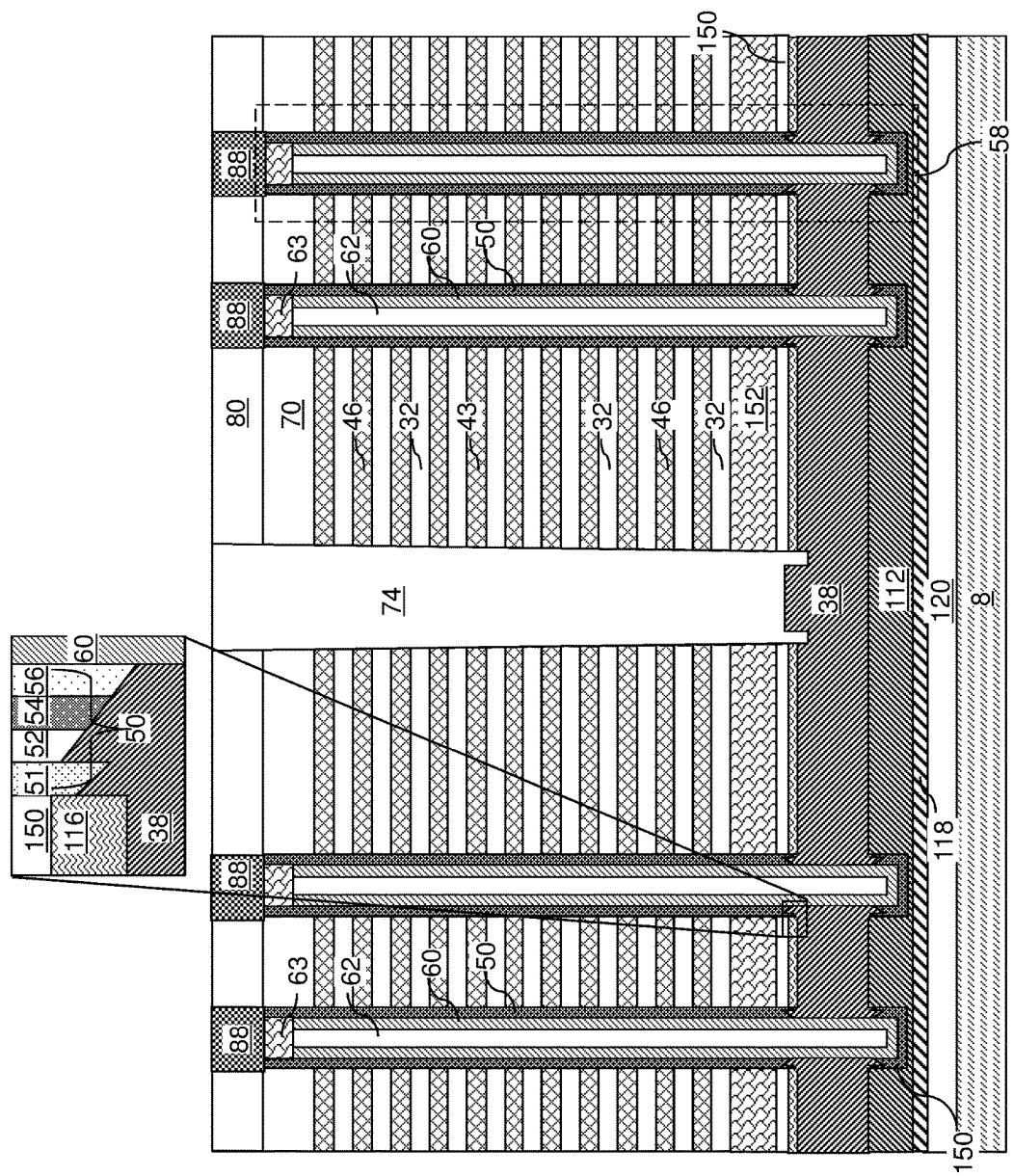

US 10,438,964 B2

THREE-DIMENSIONAL MEMORY DEVICE HAVING DIRECT SOURCE CONTACT AND METAL OXIDE BLOCKING DIELECTRIC AND METHOD OF MAKING THEREOF

FIELD

The present disclosure relates generally to the field of semiconductor devices and specifically to a three-dimensional memory structure employing direct source contact and in-memory-opening metal oxide blocking dielectrics and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises a source strap layer located over a substrate, an alternating stack of electrically conductive layers and insulating layers located over the source strap layer, and a memory stack structure that extends through the alternating stack and the source strap layer. The memory stack structure comprises a memory film vertically extending through the alternating stack and terminating above a top surface of the source strap layer, and a semiconductor channel laterally surrounded by the memory film, and contacting the source strap layer. The memory film comprises a metal oxide blocking dielectric that directly contacts each layer within the alternating stack.

According to another aspect of the present disclosure, a method of forming a three-dimensional memory device is provided. A planar material layer stack is formed over a substrate. The planar material stack includes, from bottom to top, a source semiconductor layer and a strap level sacrificial layer. An alternating stack of insulating layers and spacer material layers is formed over the planar material layer stack. The spacer material layers are formed as, or are subsequently replaced with, electrically conductive layers. A memory opening is formed through the alternating stack and the strap level sacrificial layer, and into an upper portion of the source semiconductor layer. A memory film is formed on a sidewall of the memory opening, wherein the memory film comprises, from outside to inside, a metal oxide blocking dielectric, a silicon oxide blocking dielectric, a charge trapping layer, and a tunneling dielectric layer. A semiconductor channel is formed in the memory film. A source cavity is formed by removing the strap level sacrificial layer. An outer sidewall of the semiconductor channel is physically exposed at a level of the source cavity by sequentially etching the metal oxide blocking dielectric, the silicon oxide blocking dielectric, the charge trapping layer, and the tunneling dielectric layer. A source strap layer is formed in the source cavity and directly on the outer sidewall of the semiconductor channel and on the source semiconductor layer.

BRIEF DESCRIPTION OF THE DRAWINGS

FIG. 11B is a horizontal cross-sectional view of the exemplary structure along the horizontal plane B-B' of the FIG. 11A. The vertical cross-sectional plane A-A' is the vertical cross-sectional plane of FIG. 11A.

FIG. 12B is a horizontal cross-sectional view of the exemplary structure along the horizontal plane B-B' of the FIG. 12A. The vertical cross-sectional plane A-A' is the vertical cross-sectional plane of FIG. 12A.

FIG. 16A is a vertical cross-sectional view of a memory array region of the exemplary structure after formation of various contact via structures according to an embodiment of the present disclosure.

DETAILED DESCRIPTION

Figure 1:
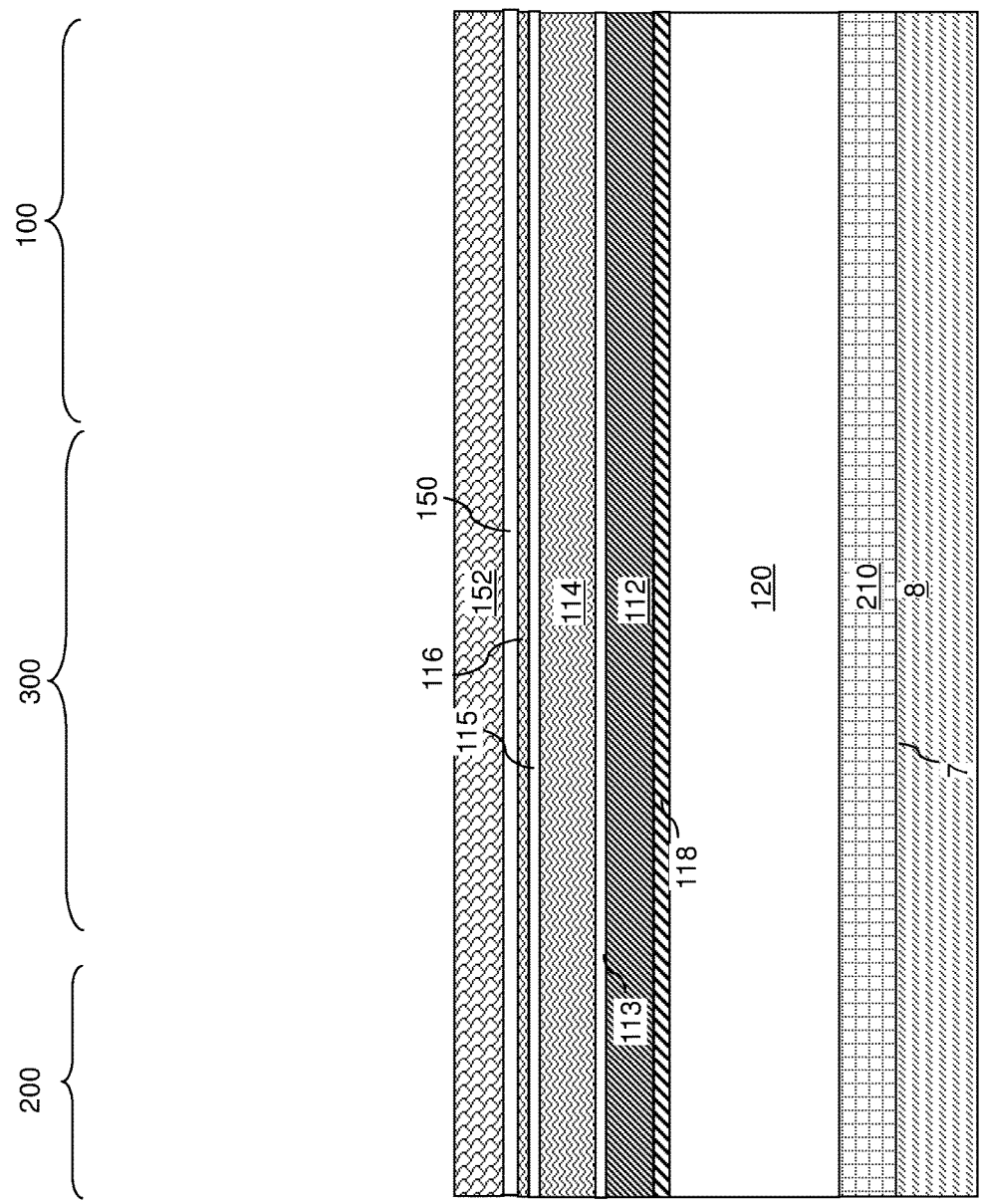
FIG. 1 is a vertical cross-sectional view of an exemplary structure after formation of an optional metallic source layer, a source semiconductor layer, a lower silicon oxide liner, a strap level sacrificial layer, an upper silicon oxide liner, a cap semiconductor layer, a gate dielectric layer, and a doped semiconductor layer according to an embodiment of the present disclosure.

Metal oxide blocking dielectrics formed in backside recesses during replacement of sacrificial material layers with electrically conductive layers occupy a significant fraction of the volumes of the backside recesses, and are not conducive to scaling of a three-dimensional memory device. However, metal oxide materials formed in the memory opening are difficult to etch anisotropically. Embodiments of the present disclosure provide a method of isotropically etching a metal oxide blocking dielectric located in the memory hole from the back side in a manner that is conducive to device scaling. The present disclosure is directed to a three-dimensional memory structure employing discrete source straps for providing direct source contact to semiconductor channels and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated. The exemplary structure includes a substrate 8, which can be a semiconductor substrate such as a silicon substrate. The substrate 8 can include a substrate semiconductor layer. The substrate semiconductor layer maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate 8 can have a major surface 7, which can be, for example, a topmost surface of the substrate semiconductor layer. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, semiconductor devices 210 can be optionally formed on the substrate 8. The semiconductor devices 210 can include, for example, field effect transistors including respective source regions, drain regions, channel regions, and gate structures. Shallow trench isolation structures (not expressly shown) can be formed in an upper portion of the semiconductor substrate 8 to provide electrical isolation among the semiconductor devices. The semiconductor devices 210 can include any semiconductor circuitry to support operation of a memory structure to be subsequently formed, which is typically referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer can be optionally formed over the semiconductor devices 210 and/or the substrate 8, which is herein referred to as at least one lower level dielectric layer 120. The at least one lower level dielectric layer 120 functions as a matrix for lower level metal interconnect structures (not explicitly shown) that provide electrical wiring among the various nodes of the semiconductor devices 210 and landing pads for through-memory-level via structures to be subsequently formed. The lower level metal interconnect structures can include various device contact via structures, lower level metal lines, lower level via structures, and lower level topmost metal structures that are configured to function as landing pads for through-memory-level via structures to be subsequently formed.

The exemplary structure can include a memory array region 100, a contact region 300, and an optional peripheral device region 200. An array of memory stack structures can be subsequently formed in the memory array region 100 and over the at least one lower level dielectric layer 120 (if present). Contacts to word lines of the memory stack structures can be subsequently formed in the contact region 300. If present, additional semiconductor devices and/or through-memory-level via structures can be formed in the peripheral device region 200. The semiconductor devices 210 may be present in any, and/or each, of the areas of the memory array region 100, the contact region 300, and the peripheral device region 200. The region of the semiconductor devices 210 and the combination of the at least one lower level dielectric layer 120 and the lower level metal interconnect structures embedded therein is herein referred to an underlying peripheral device region, which may be located underneath a memory-level assembly to be subsequently formed and includes peripheral devices for the memory-level assembly. The semiconductor devices 210 and the at least one lower level dielectric layer 120 are optional, and thus, may be omitted.

An optionally metallic source layer 118, a source semiconductor layer 112, a lower silicon oxide liner 113, and a strap level sacrificial layer 114 can be sequentially formed over the at least one lower level dielectric layer 120 and/or the substrate 8. The optional metallic source layer 118 includes a metallic material such as an elemental metal (such as tungsten), an intermetallic alloy of at least two elemental metals, a conductive metal nitride (such as TiN), or a metal silicide (such as cobalt silicide, nickel silicide, or tungsten silicide). The optional metallic source layer 118 provides a highly conductive horizontal current path for source electrodes to be subsequently formed. The optional metallic source layer 118 can be formed by a conformal deposition method or a non-conformal deposition method, and can have a thickness in a range from 20 nm to 200 nm, although lesser and greater thicknesses can also be employed.

The source semiconductor layer 112 includes a first doped semiconductor material. The dopant concentration of the source semiconductor layer 112 can be in a range from $1.0 \times 10^{19}/cm^3$ to $2.0 \times 10^{21}/cm^3$, although lesser and greater dopant concentrations can also be employed. In one embodiment, the source semiconductor layer 112 can include n-doped polysilicon, n-doped amorphous silicon that is converted into n-doped polysilicon in a subsequent processing step (such as an anneal process), or any p-doped or n-doped polycrystalline semiconductor material or any p-doped or n-doped amorphous semiconductor material that can be subsequently converted into a polycrystalline semiconductor material. In one embodiment, the type of doping of the source semiconductor layer 112 can be the same as the type of charge carriers injected into channels of memory stack structures to be subsequently formed. For example, if electrons are injected into the channels of the memory stack structures to be subsequently formed, the source semiconductor layer 112 can be n-doped. The type of doping of the source semiconductor layer 112 is herein referred to as a first conductivity type. The source semiconductor layer 112 can be deposited by a conformal deposition method (such as chemical vapor deposition) or a non-conformal deposition method. The thickness of the source semiconductor layer 112 can be in a range from 30 nm to 600 nm, although lesser and greater thicknesses can also be employed.

A planar material layer stack (113, 114, 115) is formed over the source semiconductor layer 112. The planar material layer stack (113, 114, 115) includes a stack of planar layers, i.e., a stack of layers located at a respective fixed distance from the horizontal plane including the top surface of the substrate 8. The patterned material layer stack can include, from bottom to top, a lower silicon oxide liner 113, a strap level sacrificial layer 114, and an upper silicon oxide liner 115.

The lower silicon oxide liner 113 includes doped silicate glass or undoped silicate glass (i.e., silicon oxide). The lower silicon oxide liner 113 can include thermal oxide formed by thermal oxidation of a surface portion of the source semiconductor layer 112, or can include a deposited silicon oxide material that may be formed, for example, by thermal decomposition of a silicon oxide precursor gas (such as tetraethylorthosilicate gas). The lower silicon oxide liner 113 can be deposited by a plasma enhanced chemical vapor deposition (PECVD) or low pressure chemical vapor deposition (LPCVD). The thickness of the lower silicon oxide liner 113, as measured at horizontal portions, can be in a range from 10 nm to 50 nm, although lesser and greater thicknesses can also be employed.

The strap level sacrificial layer 114 is deposited on the lower silicon oxide liner 113. The strap level sacrificial layer 114 includes a sacrificial material that can be removed selective to the lower silicon oxide liner 113 by an etch process. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. For example, the strap level sacrificial layer 114 can include amorphous silicon, germanium, an amorphous silicon-germanium alloy, or a polycrystalline semiconductor material. The material of the strap level sacrificial layer 114 may be intrinsic, p-doped, or n-doped. In one embodiment, the semiconductor material of the sacrificial semiconductor material layer 114 may be deposited without intentional doping with electrical dopants, and may be intrinsic or "lightly doped," i.e., have a doping at a dopant concentration less than $3.0 \times 10^{15}/cm^3$ caused by residual dopants incorporated during a deposition process that does not flow a dopant gas including p-type dopant atoms or n-type dopant atoms. Alternatively, the strap level sacrificial layer 114 may include amorphous carbon, diamond-like carbon, organosilicate glass, or an organic or inorganic polymer material that can be removed selective to silicon oxide. The strap level sacrificial layer 114 can be deposited by chemical vapor deposition. The thickness of the strap level sacrificial layer 114 can be in a range from 50 nm to 200 nm, although lesser and greater thicknesses can also be employed.

The upper silicon oxide liner 115 includes doped silicate glass or undoped silicate glass (i.e., silicon oxide). The upper silicon oxide liner 115 can include a deposited silicon oxide material that may be formed, for example, by thermal decomposition of a silicon oxide precursor gas (such as tetraethylorthosilicate gas). The upper silicon oxide liner 115 can be deposited by a plasma enhanced chemical vapor deposition (PECVD) or low pressure chemical vapor deposition (LPCVD). The thickness of the upper silicon oxide liner 115, as measured at horizontal portions, can be in a range from 10 nm to 50 nm, although lesser and greater thicknesses can also be employed.

A cap semiconductor layer 116 can be formed on a top surface of the second dielectric liner 115. The cap semiconductor layer 116 can include a semiconductor material layer that can function as an etch stop layer during subsequent etch of the second dielectric liner 115. For example, the cap semiconductor layer 116 can include amorphous silicon, polysilicon, or a silicon-germanium alloy. The thickness of the cap semiconductor layer 116 can be in a range from 10 nm to 40 nm, although lesser and greater thicknesses can also be employed.

A gate dielectric layer 150 and a doped semiconductor layer 152 can be sequentially formed. The gate dielectric layer 150 includes a dielectric material such as silicon oxide, a dielectric metal oxide, or a combination thereof. The thickness of the gate dielectric layer 150 can be in a range from 3 nm to 10 nm, although lesser and greater thicknesses can also be employed. The doped semiconductor layer 152 includes a doped semiconductor material such as n-doped amorphous silicon that can be converted into n-doped polysilicon in an anneal process. The thickness of the doped semiconductor layer 152 can be in a range from 100 nm to 300 nm, although lesser and greater thicknesses can also be employed. The doped semiconductor layer 152 can be subsequently employed as an etch stop layer during formation of memory openings or backside trenches through an alternating stack of material layers to be subsequently formed.

Figure 2:
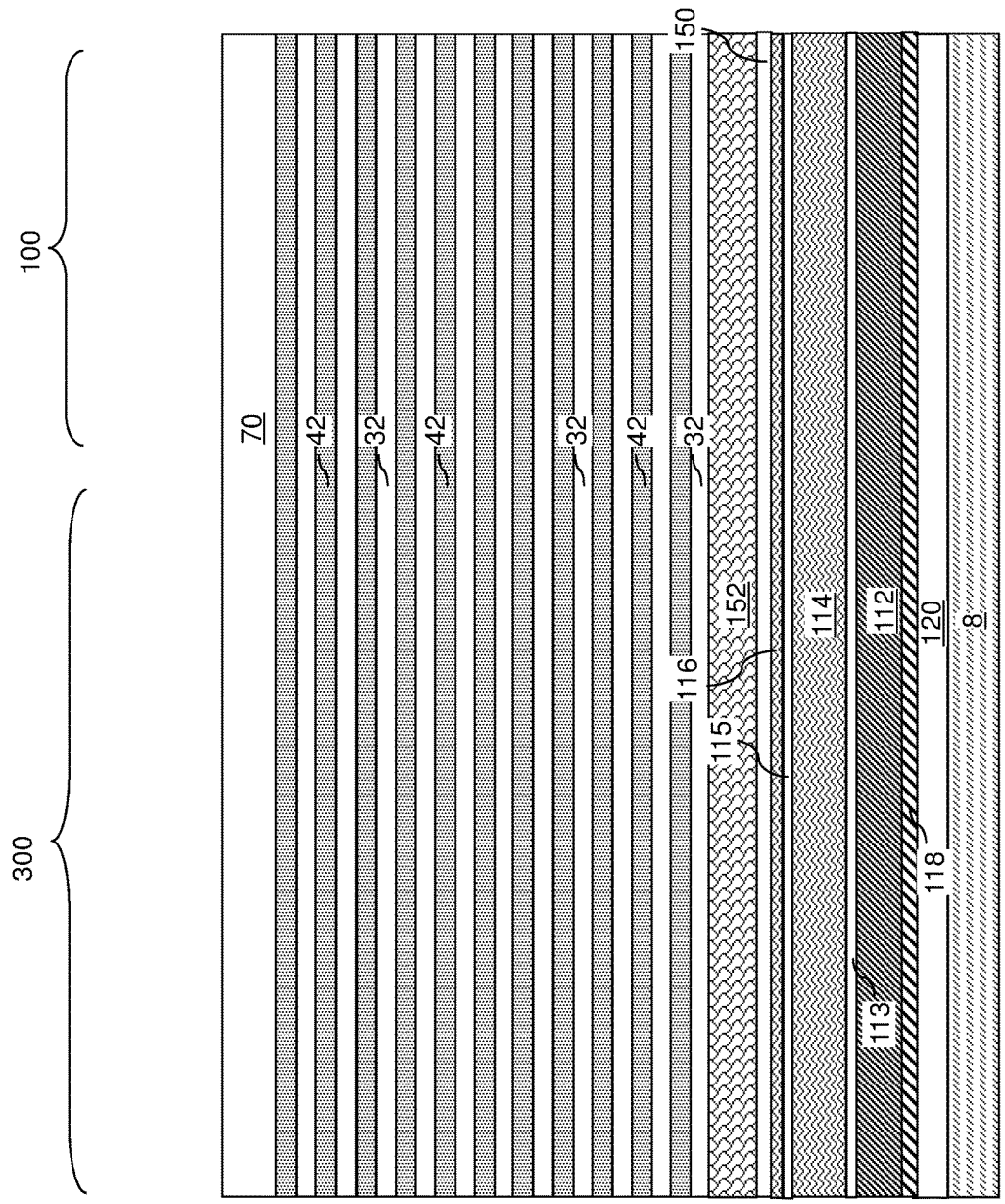
FIG. 2 is a vertical cross-sectional view of the exemplary structure after formation of an alternating stack of insulating layers and sacrificial material layers and a dielectric cap layer according to an embodiment of the present disclosure.

Referring to FIG. 2, a stack of an alternating plurality of first material layers (which can be insulating layers 32) and second material layers (which can be spacer material layers) is formed over the doped semiconductor layer 152. As used herein, a "material layer" refers to a layer including a material throughout the entirety thereof. Instances of the first material layers may have the same thickness thereamongst, or may have different thicknesses. Instances of the second elements may have the same thickness there amongst, or may have different thicknesses. Each first material layer includes a first material, and each second material layer includes a second material that is different from the first material. In one embodiment, each first material layer can be an insulating layer 32, and each second material layer can be a spacer material layer, which can be formed as a sacrificial material layer 42 and is subsequently replaced with an electrically conductive layer, or can be formed as an electrically conductive layer.

In one embodiment, an alternating stack (32, 42) of the insulating layers 32 and the sacrificial material layers 42 can be formed over the doped semiconductor layer 152. The levels of the layers in the alternating stack (32, 42) are collectively referred to as levels. The set of all structures formed in the levels is herein referred to as a structure. Thus, the alternating stack (32, 42) can include the insulating layers 32 composed of the first material, and the sacrificial material layers 42 composed of a second material different from that of the insulating layers 32. The first material of the insulating layers 32 can be at least one insulating material. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and the sacrificial material layers 42 can include silicon nitride. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

Generally, the spacer material layers may be formed as, or may be subsequently replaced with, electrically conductive layers. While the present disclosure is described employing an embodiment in which the spacer material layers are sacrificial material layers 42 that are subsequently replaced with electrically conductive layers, embodiments are expressly contemplated herein in which the electrically conductive layers are formed in lieu of the sacrificial material layers 42. In this case, steps for replacing the spacer material layers with electrically conductive layers can be omitted.

An insulating cap layer 70 can be deposited over the alternating stack (32, 42). The insulating cap layer 70 includes a material different from the material of the sacrificial material layers 42, and can include the same material as the insulating layers 32. For example, the insulating cap layer 70 can include silicon oxide. The thickness of the insulating cap layer 70 can be in a range from 30 nm to 500 nm, although lesser and greater thicknesses can also be employed.

Figure 3:
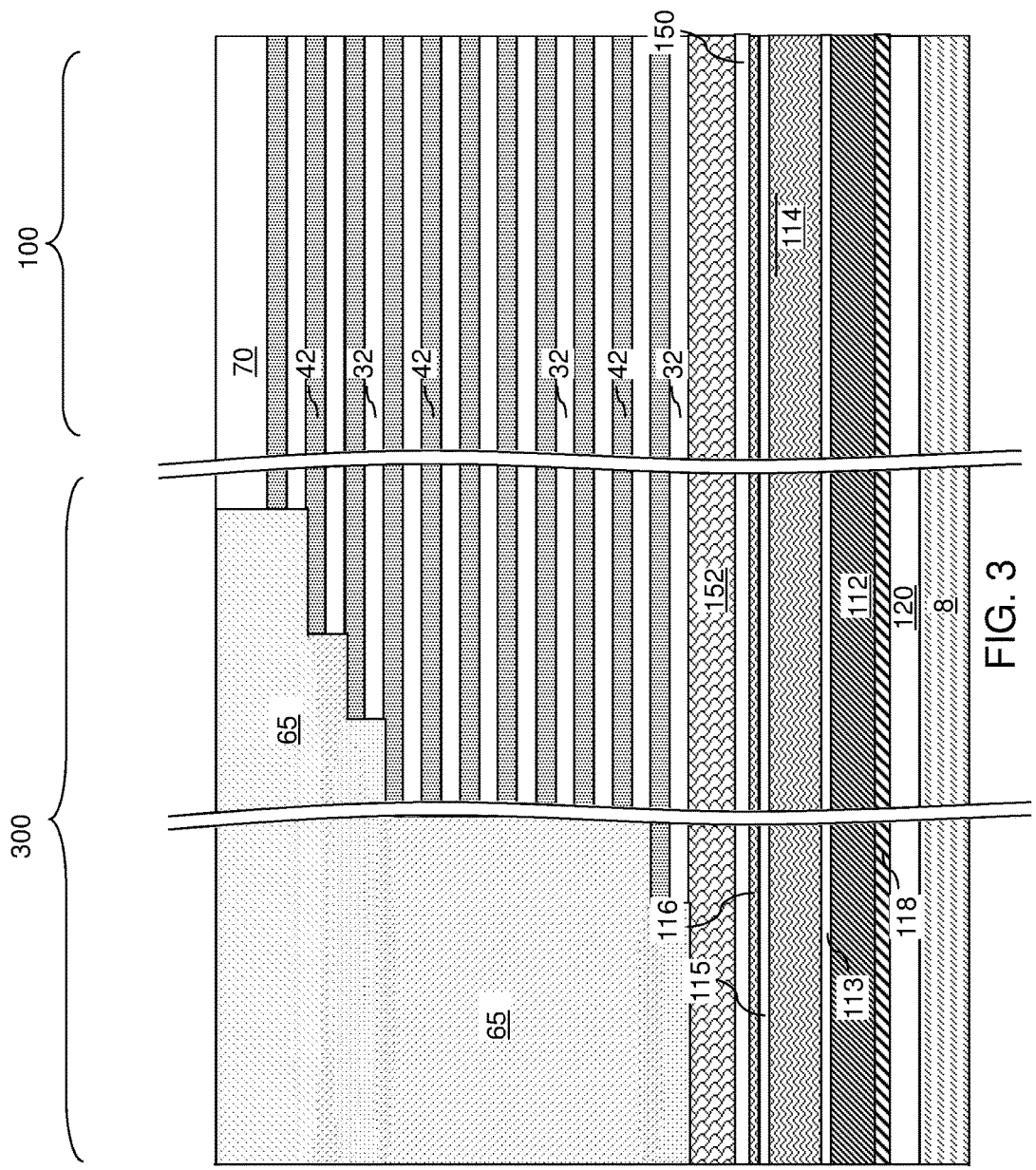
FIG. 3 is a vertical cross-sectional view of the exemplary structure after formation of stepped surfaces and a retro-stepped dielectric material portion according to an embodiment of the present disclosure.
Figure 4A:
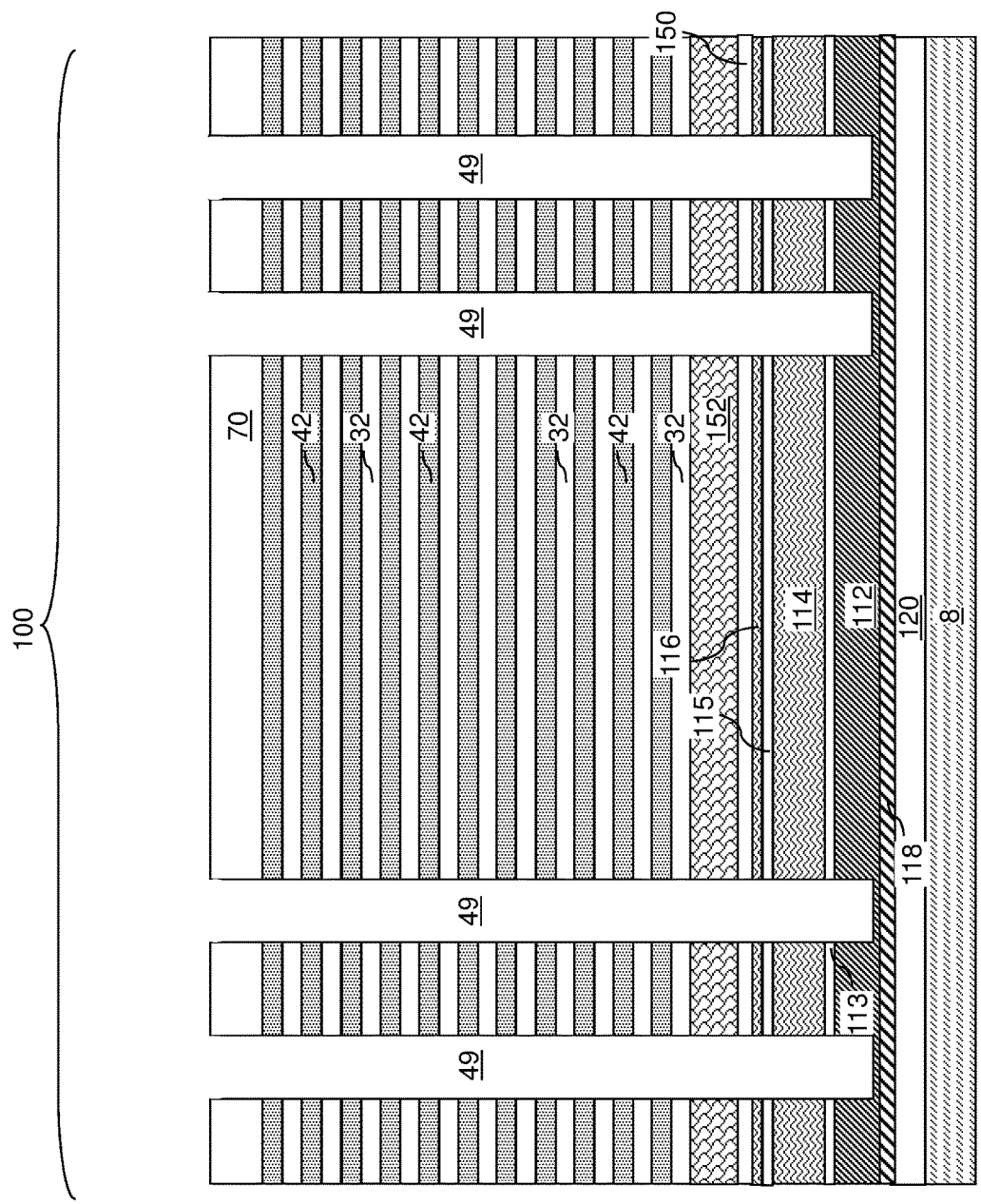
FIG. 4A is a vertical cross-sectional view of a memory array region of the exemplary structure after formation of memory openings according to an embodiment of the present disclosure.
Figure 4B:
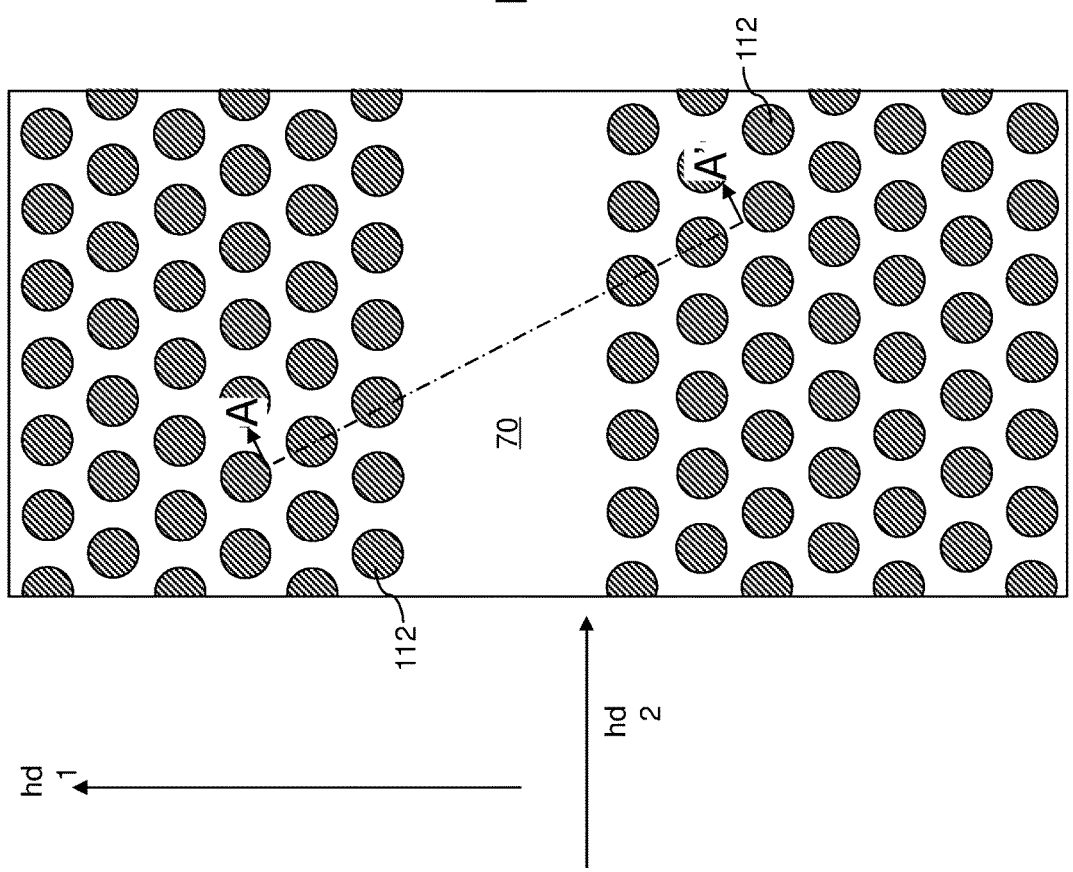
FIG. 4B is a top-down view of the exemplary structure of FIG. 4A. The plane A-A' is the plane of the vertical cross-section of FIG. 4A.
Figure 4C:
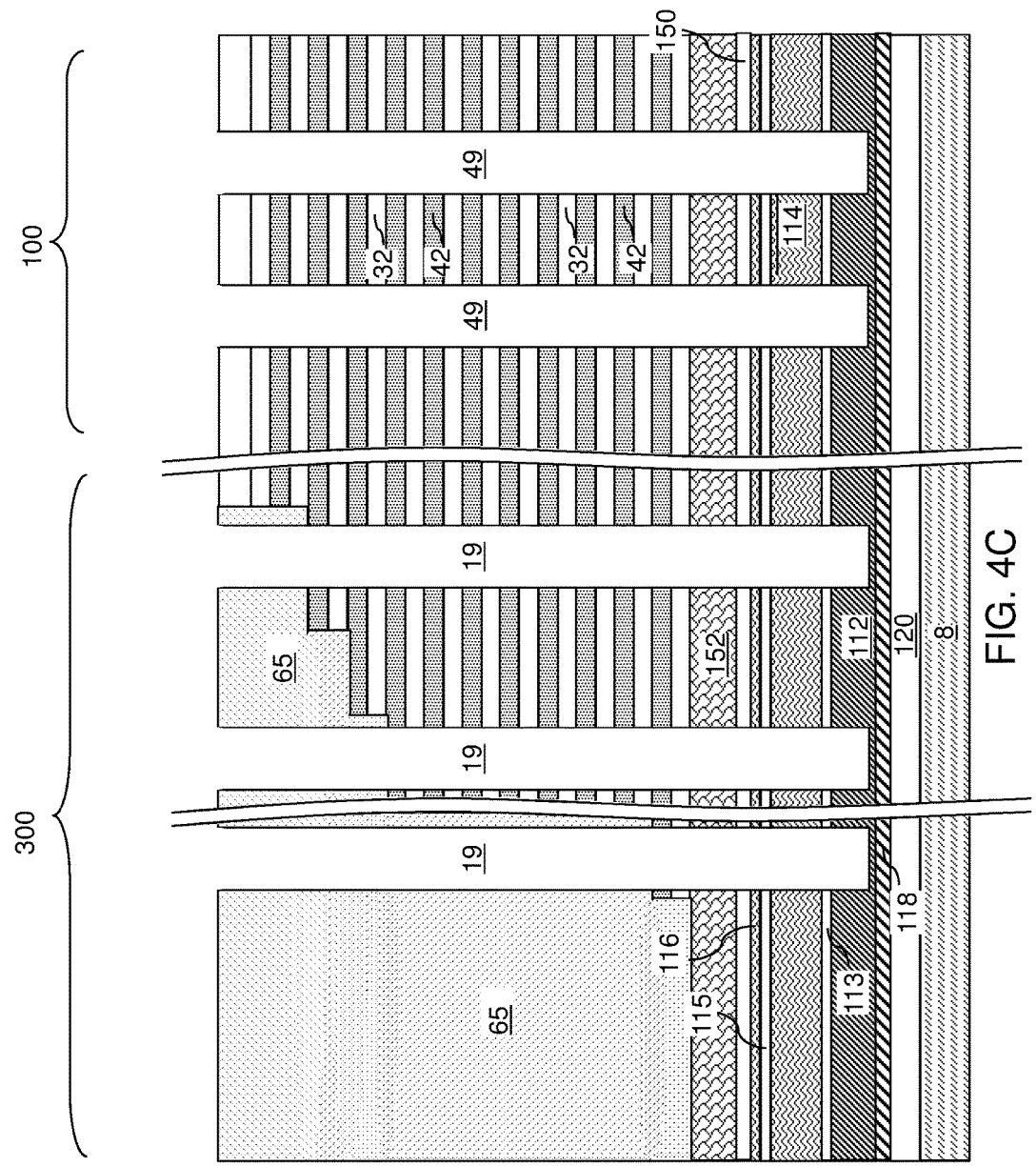
FIG. 4C is another vertical cross-sectional view of the exemplary structure of FIGS. 4A and 4B along a direction that straddles the memory array region and the contact region.
Figure 4D:
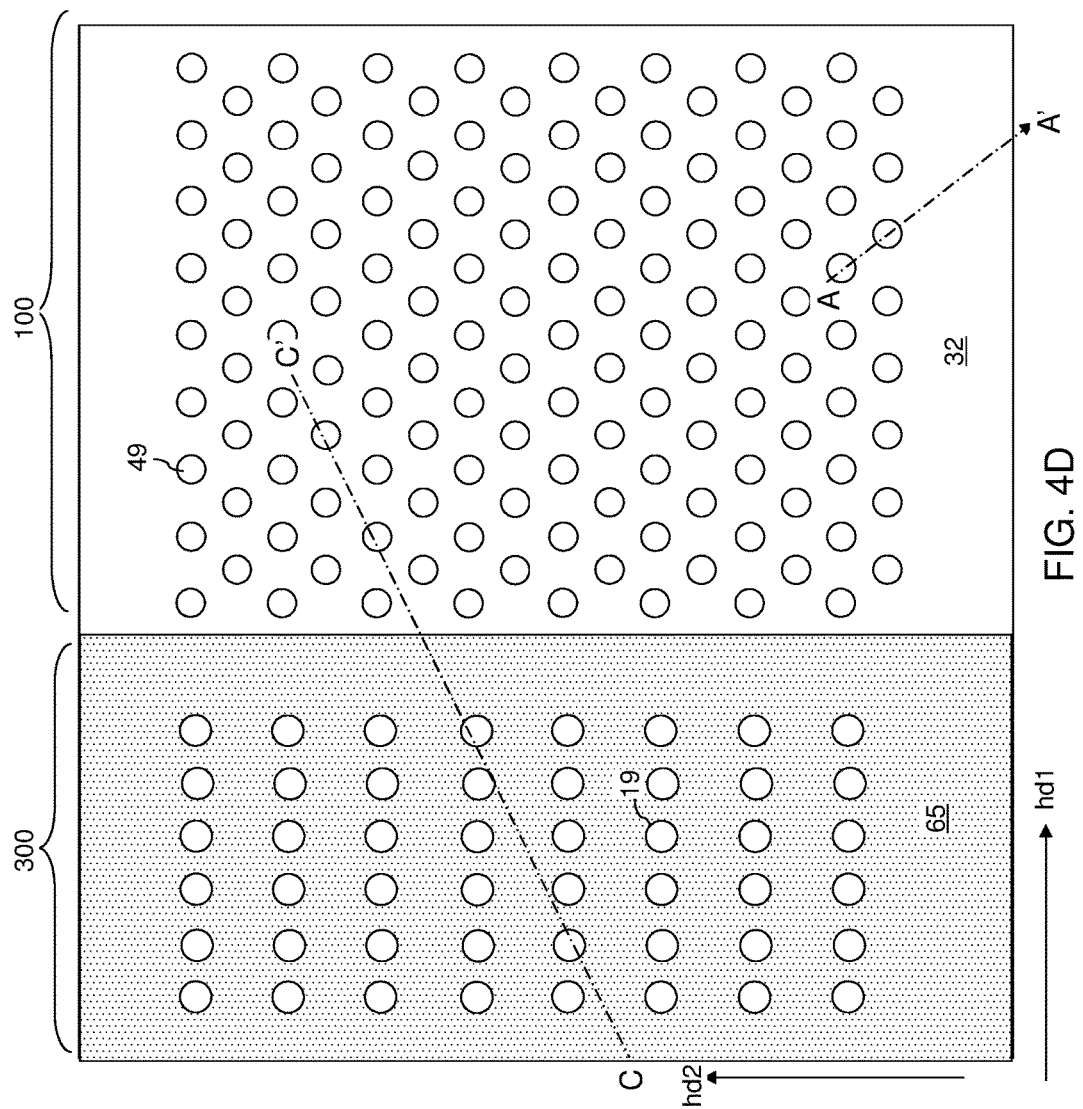
FIG. 4D is a top-down view of the exemplary structure of FIGS. 4A-4C. The plane A-A' is a portion of the plane of the vertical cross-section of FIG. 4A. The plane C-C' is the plane of the vertical cross-section of FIG. 4C.

Referring to FIG. 3, a stepped cavity can be formed within the contact region 300 which is located between the memory array region (e.g., memory plane) 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the alternating stack (32, 42), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 4A-4D, a lithographic material stack (not shown) including at least a photoresist layer can be formed over the alternating stack (32, 42) and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the retro-stepped dielectric material portion 65 and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42), the doped semiconductor layer 152, and the strap level sacrificial layer 114, and into an upper portion of the source semiconductor layer 112. The support openings 19 extend through the retro-stepped dielectric material portion 65, a subset of layers within the alternating stack (32, 42), the doped semiconductor layer 152, and the strap level sacrificial layer 114, and into an upper portion of the source semiconductor layer 112. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

Each of the memory openings 49 and the support openings 19 may have vertical sidewalls or tapered sidewalls. A two-dimensional array of memory openings 49 can be formed in the memory array region 100. A two-dimensional array of support openings 19 can be formed in the contact region 300.

Figure 5:
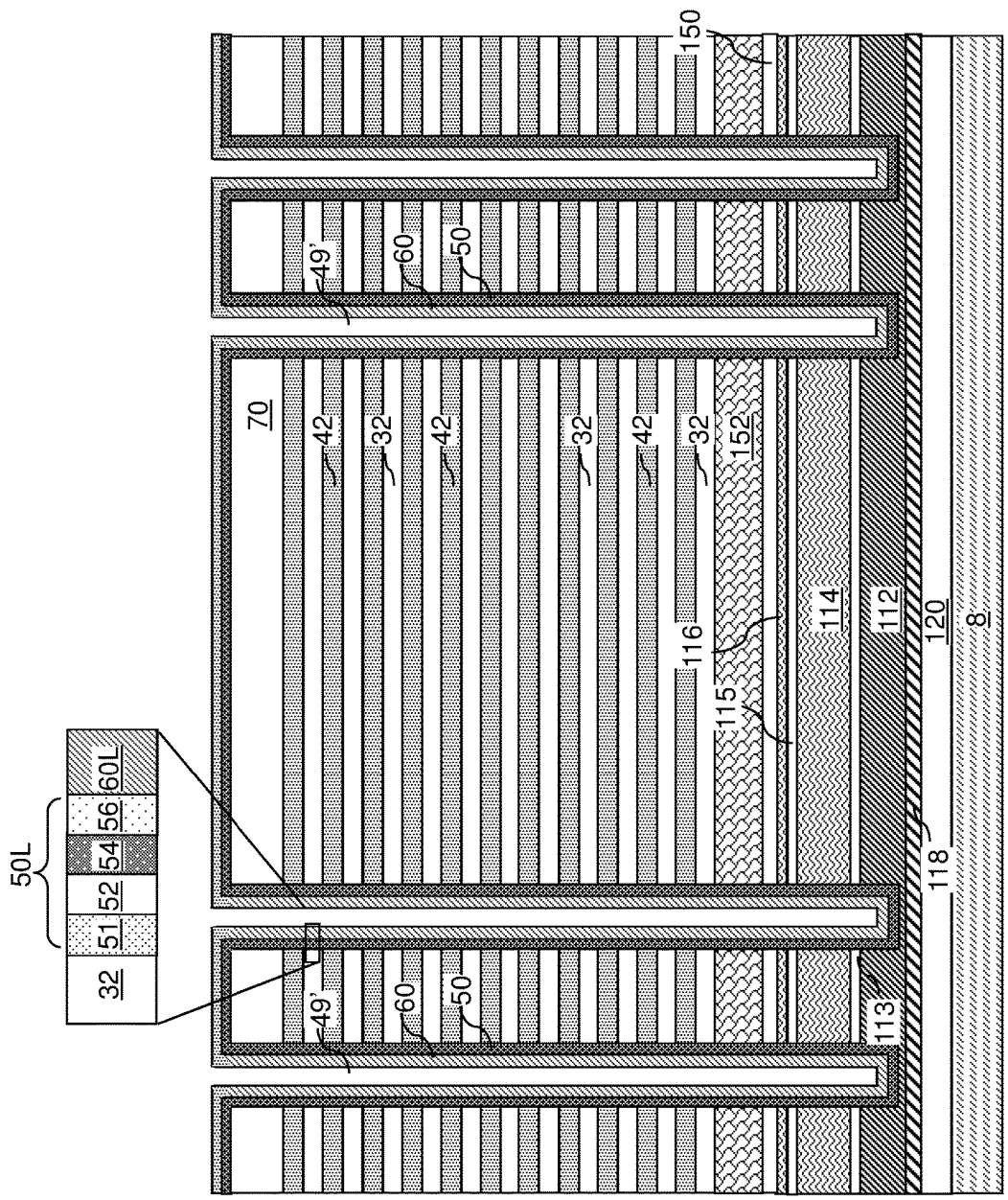
FIG. 5 is a vertical cross-sectional view of the exemplary structure after formation of a continuous memory film and a semiconductor channel layer according to an embodiment of the present disclosure.

Referring to FIG. 5, a stack of layers including a metal oxide blocking dielectric 51, a silicon oxide blocking dielectric 52, a charge storage layer 54, a tunneling dielectric layer 56, and a semiconductor channel layer 60L can be sequentially deposited in each of the memory openings 49 and the support openings 19. Each layer within the stack of layers can be deposited by a respective conformal deposition process.

The metal oxide blocking dielectric 51 is formed as a continuous conformal dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the metal oxide blocking dielectric 51 can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), zirconium oxide ($ZrO_2$) silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The metal oxide blocking dielectric 51 can subsequently function as a dielectric material portion that blocks leakage of stored electrical charges to control gate electrodes. In one embodiment, the metal oxide blocking dielectric 51 includes aluminum oxide. In one embodiment, the metal oxide blocking dielectric 51 can consist of an aluminum oxide layer. Alternatively, the metal oxide blocking dielectric 51 can include multiple dielectric metal oxide layers having different material compositions. Alternatively, the metal oxide blocking dielectric 51 can include a laminate of multi layered dielectric metal oxide layers. The metal oxide blocking dielectric 51 directly contacts each layer within the alternating stack (32, 42).

The silicon oxide blocking dielectric 52 includes silicon oxide. The silicon oxide blocking dielectric 52 can be formed by a conformal deposition method such as low pressure chemical vapor deposition, atomic layer deposition, or a combination thereof. For example, the silicon oxide blocking dielectric 52 can be deposited by thermal decomposition of tetraethylorthosilicate (TEOS) in a low pressure chemical vapor deposition (LPCVD) process. The thickness of the dielectric semiconductor compound can be in a range from 1 nm to 20 nm, although lesser and greater thicknesses can also be employed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide, zirconium oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The combination of the blocking dielectric layer 52, the charge storage layer 54, and the tunneling dielectric layer 56 is herein referred to as a memory film 50.

The stack of the metal oxide blocking dielectric 51, the silicon oxide blocking dielectric 52, the charge trapping layer 54, and the tunneling dielectric layer 56 constitutes a memory film 50. Each portion of the charge trapping layer 54 located adjacent to the sacrificial material layers 42 (or electrically conductive layers in case the electrically conductive layers are formed in lieu of the sacrificial material layers 42) constitutes a memory element. Thus, each portion of the memory film 50 within a memory opening 49 includes a vertical stack of memory elements.

The semiconductor channel layer 60L includes a semiconductor material that is employed to form semiconductor channels. The semiconductor channel layer 60L includes at least one semiconductor material that may include at least one elemental semiconductor material, at least one III-V compound semiconductor material, at least one II-VI compound semiconductor material, at least one organic semiconductor material, or other semiconductor materials known in the art. In one embodiment, the semiconductor channel layer includes amorphous silicon or polysilicon. The semiconductor channel layer can be formed by a conformal deposition method such as low pressure chemical vapor deposition (LPCVD). The thickness of the semiconductor channel layer 60L can be in a range from 2 nm to 10 nm, although lesser and greater thicknesses can also be employed. A memory cavity may be present in the volume of each memory opening 49 that is not filled with the deposited material layers (51, 52, 54, 56, 60L).

Figure 6:
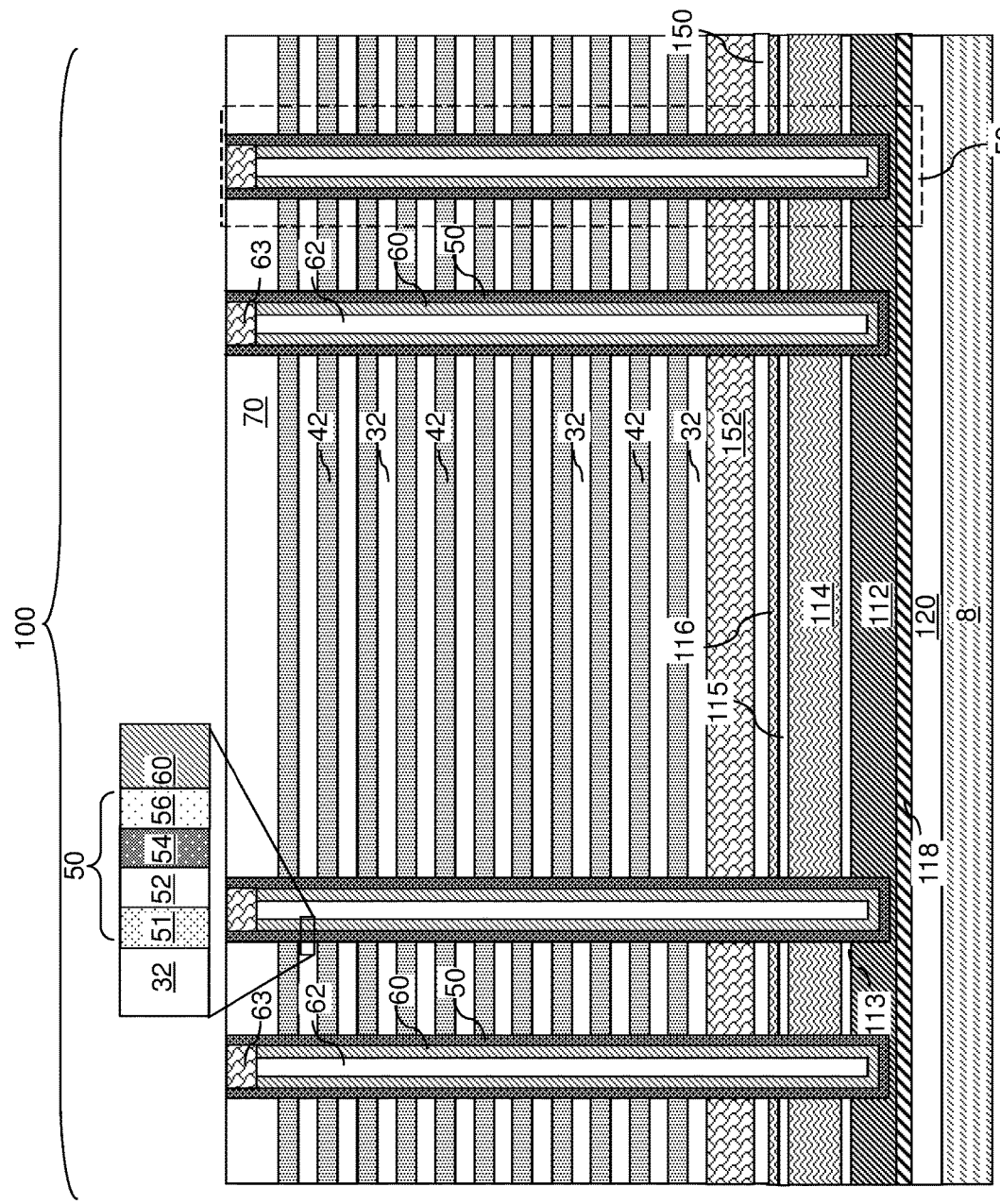
FIG. 6 is a vertical cross-sectional view of the exemplary structure after formation of memory opening fill structures that include a memory film, a semiconductor channel, a dielectric core, and a drain region according to an embodiment of the present disclosure.

Referring to FIG. 6, a dielectric fill material can be deposited to fill the memory cavities (i.e., unfilled volumes) within the memory openings 49 and the support openings 19. The dielectric fill material can include, for example, silicon oxide or organosilicate glass. The material can be deposited by a conformal deposition method such as low pressure chemical vapor deposition (LPCVD), or by a self-planarizing deposition process such as spin coating. The dielectric fill material and the memory film 50 can be removed from above the top surface of the insulating cap layer 70 by a planarization process, which can include a recess etch process and/or chemical mechanical planarization (CMP) process. A remaining portion of the memory film 50 is present within each memory opening 49. A remaining portion of the semiconductor channel layer 60L is present within each memory opening 49 and constitutes a semiconductor channel 60. A remaining portion of the dielectric fill material is present within each memory opening 49, and is herein referred to as a dielectric core 62.

The dielectric core 62 (and optionally an upper end of the semiconductor channel 60) can be vertically recessed below a horizontal plane including the top surface of the insulating cap layer 70 prior to, during, or after removal of the horizontal portions of the memory film 50 from above the horizontal plane including the top surface of the insulating cap layer 70. Subsequently, a doped semiconductor material having a doping of the first conductivity type can be deposited within the recessed volumes overlying the dielectric cores 62 inside the memory openings 49 to form drain regions 63. For example, the drain regions 63 can include n-doped polysilicon or n-doped amorphous silicon that can be converted into n-doped polysilicon in a subsequent anneal process.

Each memory film 50 includes a metal oxide blocking dielectric 51, a silicon oxide blocking dielectric 52 contacting an inner sidewall of the metal oxide blocking dielectric 51, a charge trapping layer 54 contacting an inner sidewall of the silicon oxide blocking dielectric 52, and a tunneling dielectric layer 56 contacting an inner sidewall of the charge trapping layer 54. Each combination of a memory film 50 and a semiconductor channel 60 within a memory opening 49 constitutes a memory stack structure (50, 60). The memory stack structure (50, 60) is a combination of a semiconductor channel 60, a tunneling dielectric layer 56, a plurality of memory elements as embodied as portions of the charge storage layer 54, a silicon oxide blocking dielectric 52, and a metal oxide blocking dielectric 51. Each combination of a memory stack structure (50, 60), a dielectric core 62, and a drain region 63 within a memory opening 49 constitutes a memory opening fill structure 58. The same combination can be formed within each support opening to provide support pillar structures in the contact region 300. The support pillar structures are electrically inactive structures that provide structural support during subsequent replacement of the sacrificial material layers 42 and the strap level sacrificial layer 114.

Thus, each memory stack structure (50, 60) includes a semiconductor channel 60 and a memory film 50 laterally surrounding the semiconductor channel 60. An array of memory opening fill structures 58 can extend through each of the alternating stack (32, 42) and into an upper portion of the source semiconductor layer 112.

Figure 7:
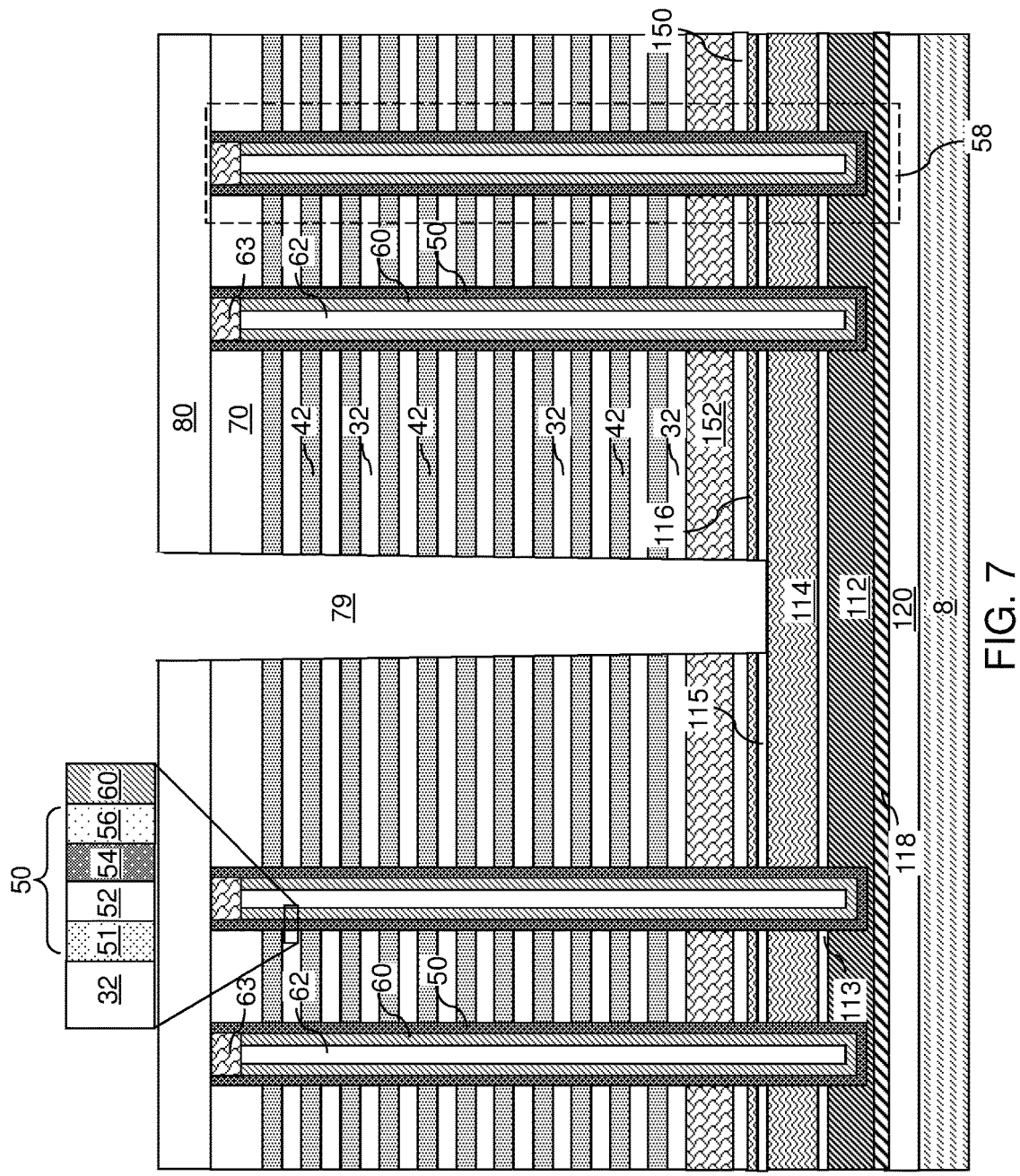
FIG. 7 is vertical cross-sectional view of the exemplary structure after formation of a backside trench according to an embodiment of the present disclosure.

Referring to FIG. 7, a contact level dielectric layer 80 can be optionally formed over the insulating cap layer 70. The contact level dielectric layer 80 includes a dielectric material that is different from the dielectric material of the sacrificial material layers 42. For example, the contact level dielectric layer 80 can include silicon oxide. The contact level dielectric layer 80 can have a thickness in a range from 50 nm to 500 nm, although lesser and greater thicknesses can also be employed.

A photoresist layer (not shown) can be applied over the contact level dielectric layer 80, and can be lithographically patterned to form openings in areas between clusters of memory opening fill structures 58. The pattern in the photoresist layer can be transferred through the contact level dielectric layer 80, the at least one alternating stack (32, 42) and/or the at least one retro-stepped dielectric material portion 65 employing an anisotropic etch to form backside trenches 79. The backside trenches 79 vertically extend from the top surface of the contact level dielectric layer 80, through the alternating stack (32, 42), the doped semiconductor layer 152, the gate dielectric layer 150, the cap semiconductor layer 116, and the upper silicon oxide liner 115. The backside trenches 79 can be formed between clusters (e.g., memory blocks) of memory opening fill structures 58. The photoresist layer can be removed, for example, by ashing.

Figure 8:
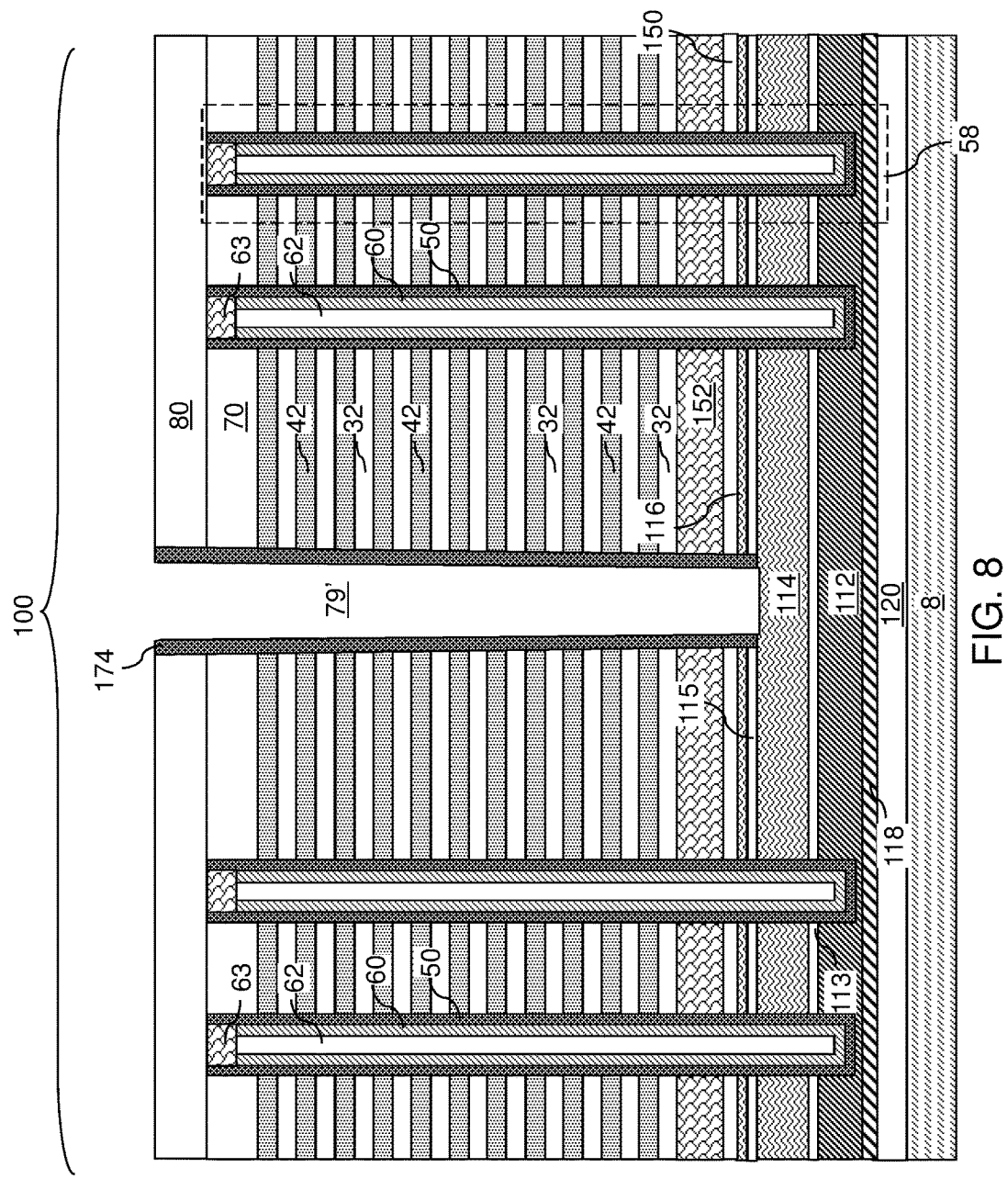
FIG. 8 is a vertical cross-sectional view of the exemplary structure after formation of a trench spacer according to an embodiment of the present disclosure.

Referring to FIG. 8, a trench spacer 174 can be formed on the sidewalls of each backside trench 79 by deposition of a conformal material layer and an anisotropic etch. The trench spacer 174 includes a material that is resistant to an etchant to be subsequently employed to etch the strap level sacrificial layer 114. For example, the trench spacer 174 can include silicon nitride. The thickness of the trench spacer 174 can be in a range from 10 nm to 30 nm, although lesser and greater thicknesses can also be employed. A trench cavity 79' can be located inside a trench spacer 174 within each backside trench 79. A top surface of the strap level sacrificial layer 114 is physically exposed at the bottom of each backside trench 79.

Figure 9:
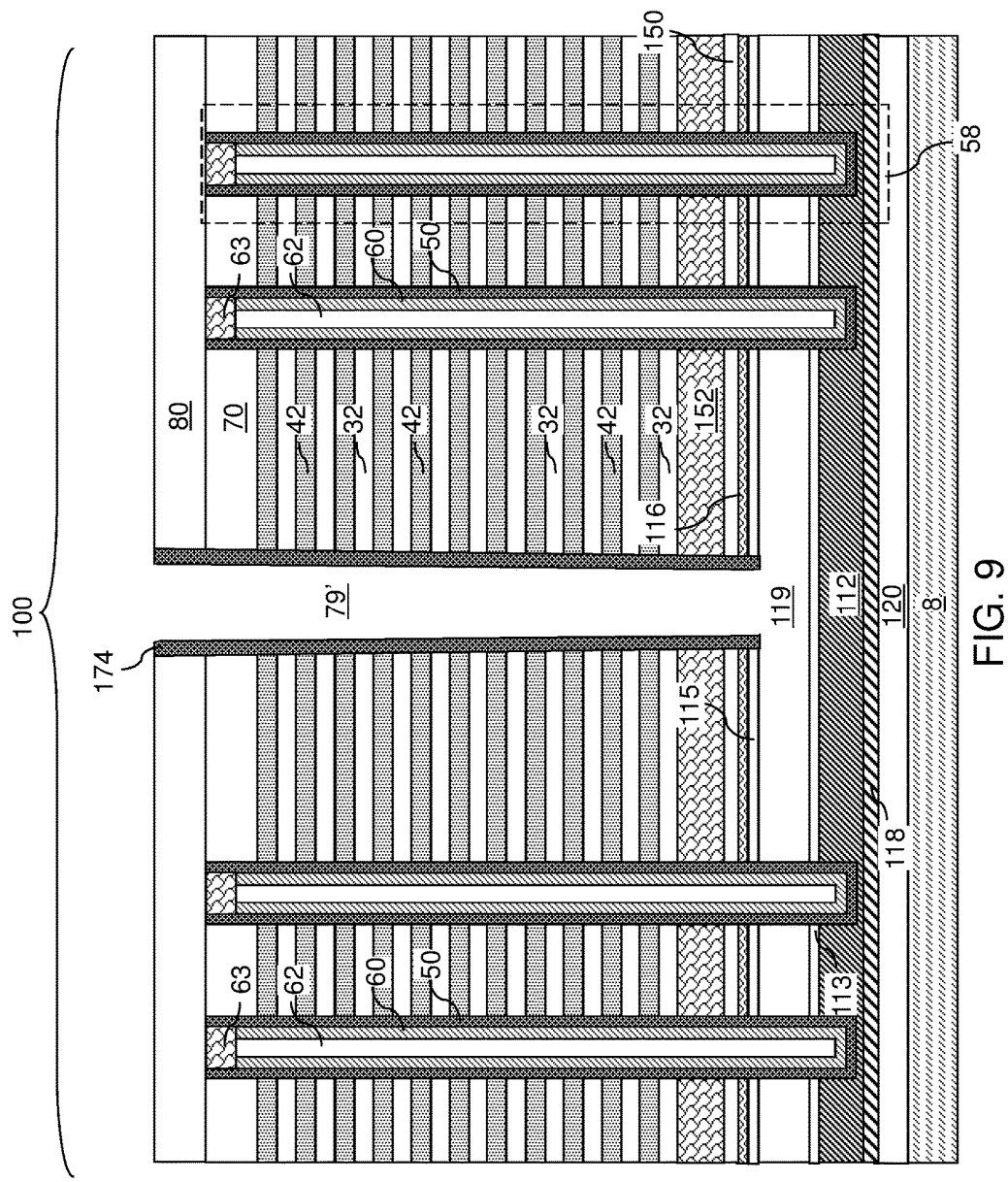
FIG. 9 is a vertical cross-sectional view of the exemplary structure after formation of a source cavity according to an embodiment of the present disclosure.

Referring to FIG. 9, a first isotropic etch process can be performed employing an etchant that etches the material of the strap level sacrificial layers 114 selective to the lower silicon oxide liner 113, the upper silicon oxide liner 115, and the trench spacers 174. The etchant can be introduced through the backside trenches 79. The etchant can be a liquid phase etchant applied in a wet etch process, or a gas phase etchant applied in a dry etch process. In an illustrative example, the strap level sacrificial layer 114 includes amorphous silicon, and a wet etch process employing a trimethyl-2 hydroxyethyl ammonium hydroxide (TMY) solution, a wet etch process employing a KOH solution, or a dry etch process employing gas phase HCl may be employed to isotropically etch that strap level sacrificial layer 114. Each memory film 50 can include a material layer that is not etched by the etchant of the first isotropic etch process. For example, each memory film 50 can include a silicon oxide blocking dielectric 52 including a silicon oxide material that is resistant to the etchant of the first isotropic etch process. The strap level sacrificial layer 114 can be completely removed. A source cavity 119 can be formed by removal of the strap level sacrificial layer 114. In one embodiment, the first isotropic etch process isotropically etches the material of the strap level sacrificial layer 114 selective to the upper and lower silicon oxide liners (113, 115) and the metal oxide blocking dielectrics 51.

Figure 10:
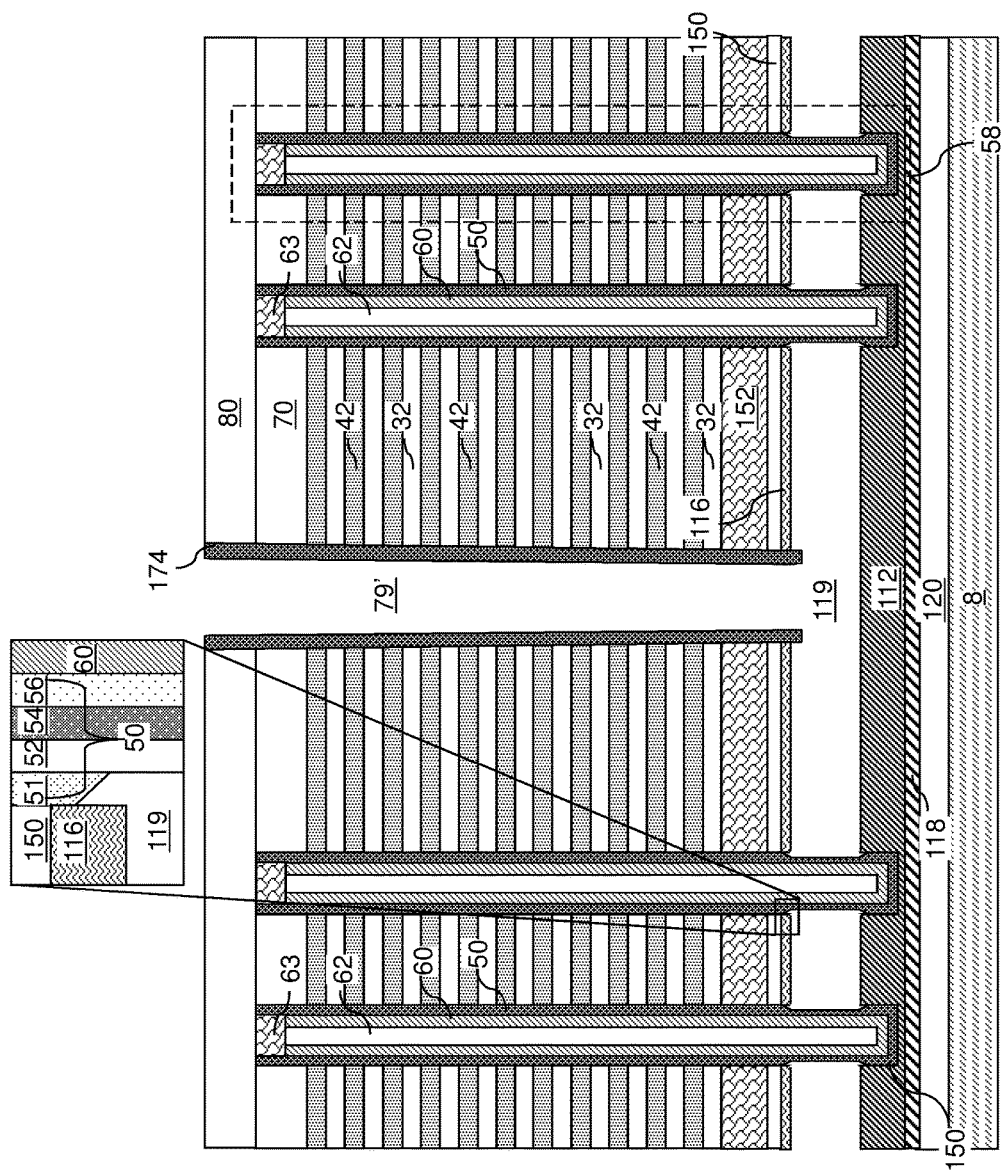
FIG. 10 is a vertical cross-sectional view of the exemplary structure after removal of physically exposed portions of dielectric metal oxide blocking dielectrics according to an embodiment of the present disclosure.

Subsequently, an outer sidewall of each semiconductor channel 60 is physically exposed at the level of the source cavity 119 by sequentially etching the metal oxide blocking dielectrics 51, the silicon oxide blocking dielectrics 52, the charge trapping layers 54, and the tunneling dielectric layers 56. Referring to FIG. 10, physically exposed portions of the metal oxide blocking dielectrics 51 are removed at the level of the source cavity 119. Specifically, a second isotropic etch process can be performed by introducing at least another etchant through the backside trenches 79 into the source cavities 119. The etchant of the second isotropic etch process removes the material of the metal oxide blocking dielectrics 51 selective to the material of the silicon oxide blocking dielectrics 52 (i.e., silicon oxide) with a selectivity greater than 10, and preferably with a selectivity greater than 30.

In one embodiment, the metal oxide blocking dielectrics 51 can comprise, or consist essentially of, aluminum oxide. In this case, etching of the metal oxide blocking dielectrics 51 can be performed by an atomic layer etching (ALE) process. In one embodiment, the ALE process alternately applies a metal organic precursor and hydrofluoric acid vapor. The metal organic precursor may be trimethylaluminum (TMA) vapor or tin acetate vapor. The atomic layer etching process may be conducted at an elevated temperature, such as above 200 degrees Celsius, such as 250 to 325 degrees Celsius, at a sub-atmospheric pressure (such as 10 mTorr or less). Alternate application of the two component gases can etch one layer of a material per cycle, and can provide high selectivity between the etched material and materials that are not etched.

For example, trimethylaluminum (TMA) vapor and hydrofluoric acid (HF) vapor can be alternately applied per cycle at a temperature of 250 to 325 degrees Celsius, such as 300 degrees Celsius to etch aluminum oxide. Without wishing to be bound by a particular theory, it is believed that hydrofluoric acid vapor combines with aluminum oxide to form aluminum trifluoride (AlF$_3$). Trimethylaluminum vapor reacts with aluminum trifluoride and undergoes a ligand exchange process, thereby producing volatile AlF (CH$_3$)$_2$, which is removed from the surface of the remaining portions of the aluminum oxide material. Alternate application of TMA and HF vapor can provide an etch rate of about 4.8 nm per 100 cycles for aluminum oxide, 1.0 nm per 100 cycles for hafnium oxide, less than 0.1 nm per 100 cycles for silicon oxide, less than 0.1 nm per cycle for silicon nitride, and less than 0.1 nm per 100 cycles for TiN. Thus, aluminum oxide can be etched with selectivity greater than 30 with respect to silicon oxide of the upper and lower silicon oxide liners (113, 115) and the silicon oxide blocking dielectrics 52 and silicon nitride of the trench spacer 174. In another embodiment, other high-k material combinations may be used as a blocking dielectric in place of aluminum oxide, and the specific ALE chemistry may be adjusted accordingly for the other material combinations to obtain better selectivity.

The second isotropic etch process etches the metal oxide blocking dielectric isotropically, thereby forming tapered sidewalls in remaining portions of the metal oxide blocking dielectrics 51. Thus, the outer sidewall of each remaining portion of the metal oxide blocking dielectrics 51 extending through the alternating stack (32, 42) extends farther downward than inner sidewall of the same remaining portion of the metal oxide blocking dielectrics 51. The outer sidewall of each remaining portion of the metal oxide blocking dielectrics 51 embedded within the source semiconductor layer 112 extends farther upward than inner sidewall of the same remaining portion of the metal oxide blocking dielectrics 51.

Figure 11A:
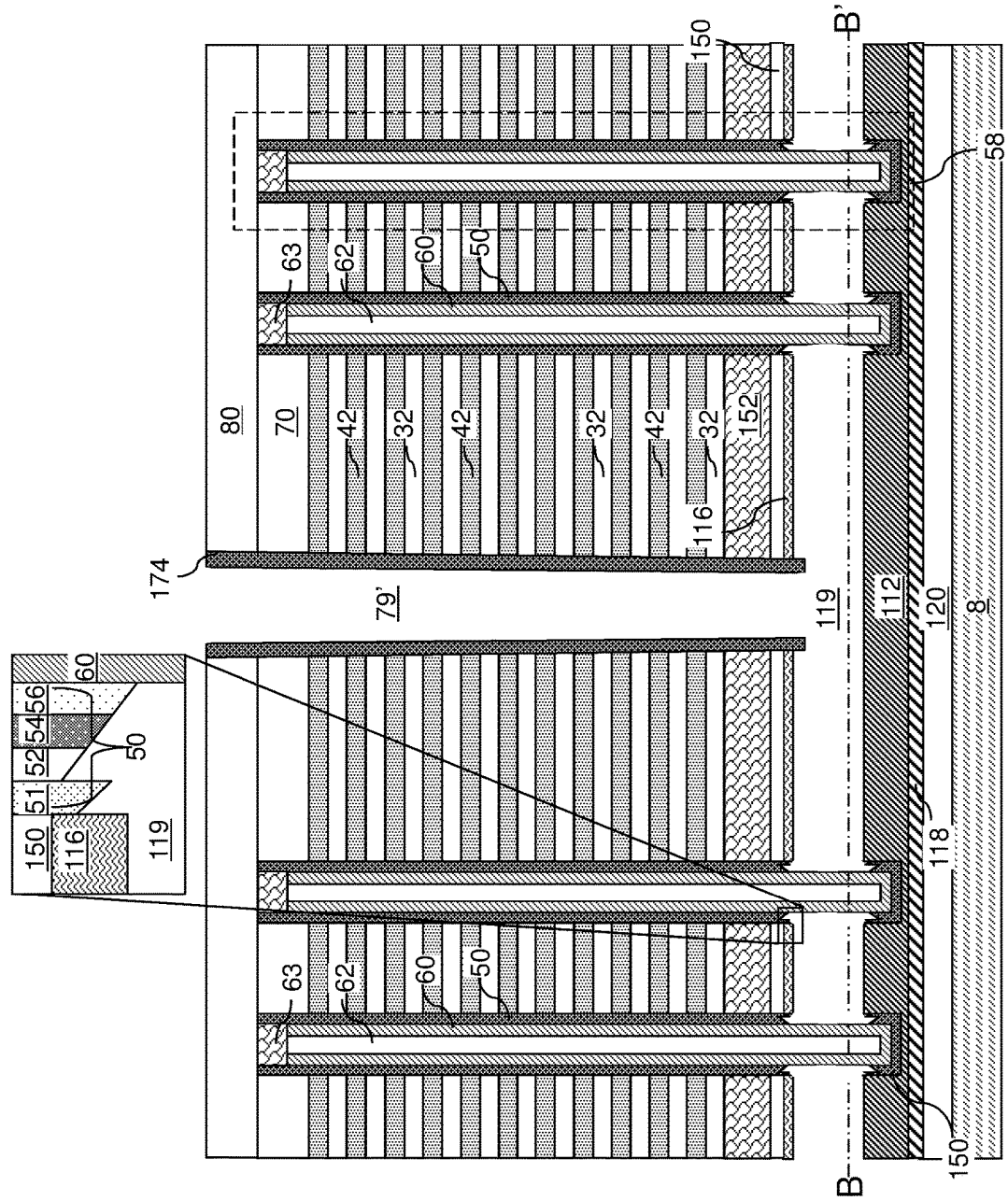
FIG. 11A is a vertical cross-sectional view of the exemplary structure after removal of portions of the silicon oxide blocking dielectrics, the charge trapping layers, and the tunneling dielectric layers at the level of the source cavity according to an embodiment of the present disclosure.

Referring to FIGS. 11A and 11B, physically exposed portions of the silicon oxide blocking dielectrics 52, the charge trapping layers 54, and the tunneling dielectric layers 56 are removed at the level of the source cavity 119. Specifically, a third isotropic etch process can be performed by introducing at least one etchant through the backside trenches 79 into the source cavities 119. The third isotropic etch process removes materials of the silicon oxide blocking dielectrics 52, the charge trapping layers 54, and the tunneling dielectric layers 56 selective to the materials of the semiconductor channels 60, the source semiconductor layer 112, the cap semiconductor layer 116, and the metal oxide blocking dielectrics 51. In one embodiment, etching of the silicon oxide blocking dielectrics 52, the charge trapping layers 54, and the tunneling dielectric layers 56 can be performed by isotropic etch processes that sequentially etch the silicon oxide blocking dielectrics 52, the charge trapping layers 54, and the tunneling dielectric layers 56 selective to the material of the metal oxide blocking dielectrics 51 with a selectivity greater than 10.

For example, the third isotropic etch process can include a first etch step that etches the material of the silicon oxide blocking dielectrics 52, a second etch step that etches the material of the charge storage layers 54, and a third etch stop that etches the material of the tunneling dielectric layers 56. In an illustrative example, the silicon oxide blocking dielectric 52 can include silicon oxide, the charge storage layer 54 can include silicon nitride, and the tunneling dielectric layer 56 can include silicon oxide or an ONO stack. In this case, the first etch step can include a wet etch or a vapor phase etch employing hydrofluoric acid, the second etch step can employ a wet etch employing hot phosphoric acid, and the third etch step can employ another etch step employing hydrofluoric acid.

The lower and upper silicon oxide liners (113, 115) can be collaterally removed during etching of the silicon oxide blocking dielectrics 52. Any remaining portion of the lower and upper silicon oxide liners (113, 115) can be removed during etching of the tunneling dielectric layers 56. A top surface of the source semiconductor layer 112 and a bottom surface of the cap semiconductor layer 116 are physically exposed after removal of portions of the tunneling dielectric layers 56.

In one embodiment, the metal oxide blocking dielectrics 51 extending through the alternating stack (32, 42) may vertically protrude further downward than the silicon oxide blocking dielectrics 52 due to the selectivity of the third isotropic etch process with respect to the material of the metal oxide blocking dielectrics 51. The inner sidewall (i.e., sidewall closer to the semiconductor channel 60) of each metal oxide blocking dielectric 51 extending through the alternating stack (32, 42) may vertically extend farther downward than an outer sidewall (i.e., sidewall farther from the semiconductor channel 60) of the metal oxide blocking dielectric 51. In one embodiment, the bottom periphery of each interface between a silicon oxide blocking dielectric 52 extending through the alternating stack (32, 42) and a metal oxide blocking dielectric 51 can be located above the bottom periphery of the inner sidewall of the metal oxide blocking dielectric 51. Each silicon oxide blocking dielectric 52 that passes through the alternating stack (32, 42), each charge trapping layer 54 that passes through the alternating stack (32, 42), and each tunneling dielectric layer 56 that passes through the alternating stack (32, 42) can have a respective tapered bottom surface due to the isotropic nature of the etch steps employed to etch the materials of the silicon oxide blocking dielectrics 52, the charge trapping layers 54, and the tunneling dielectric layers 56. As used herein, a tapered surface refers to a non-horizontal and non-vertical surface. The taper angles can be in a range from 30 degrees to 60 degrees, and may be substantially 45 degrees.

Each remaining portion of the memory film 50 located underneath the physically exposed outer sidewalls of the semiconductor channels 60 forms a dielectric material cap portion 150 that is embedded within the source semiconductor layer 112. Each dielectric material cap portion 150 is formed by a remaining portion of the memory film 50 after the outer sidewalls of the semiconductor channels are physically exposed. Each dielectric material cap portion 150 underlies, and contacts, a bottom surface of a respective semiconductor channel 60, and is embedded within the source semiconductor layer 112. Each dielectric material cap portion 150 comprises the same layer stack of dielectric materials as the memory films 50.

Figure 12A:
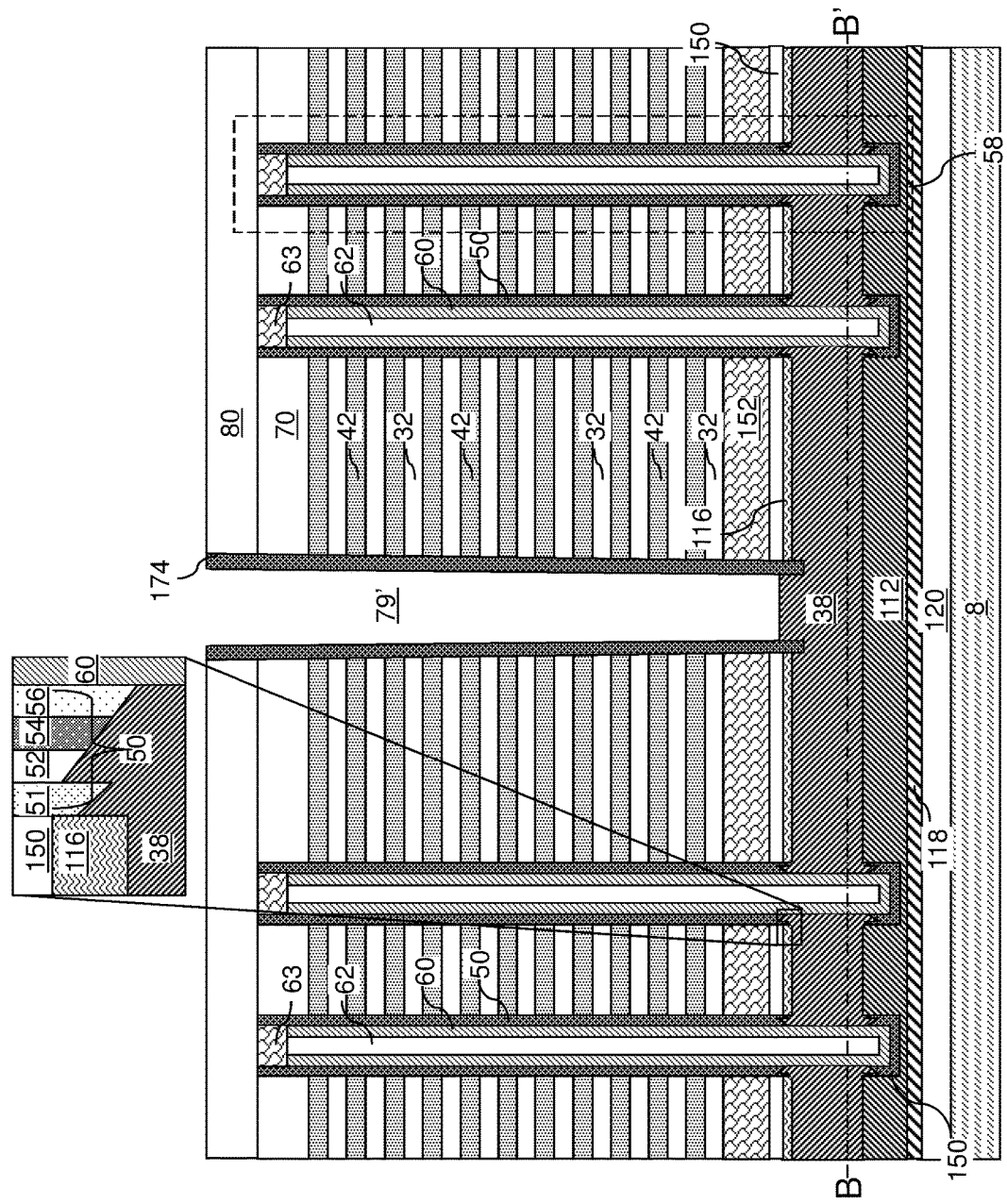
FIG. 12A is a vertical cross-sectional view of the exemplary structure after formation of a source strap layer according to an embodiment of the present disclosure.

Referring to FIGS. 12A and 12B, a source strap layer 38 can be formed on physically exposed surfaces of the semiconductor channels 60 and on physically exposed surfaces of the source semiconductor layer 112 by a selective semiconductor deposition process. The selective semiconductor deposition process deposits a second doped semiconductor material having a doping of the same conductivity type as the source semiconductor layer 112, which includes the first doped semiconductor material. In one embodiment, the doped semiconductor material that is deposited by the selective semiconductor deposition process can be heavily doped to provide a conductive semiconductor material, i.e., a doped semiconductor material having electrical conductivity greater than $1.0 \times 10^5$ S/cm.

A selective semiconductor deposition process is a deposition process in which a reactant for depositing a semiconductor material and an etchant that etches the semiconductor material are concurrently or alternately flowed into a process chamber such that the etch rate of the semiconductor material provided by the etchant is between the higher growth rate of the semiconductor material on semiconductor surfaces and the lower growth rate (or the nucleation rate) of the semiconductor material on dielectric surfaces. A net deposition of the semiconductor material occurs only on the semiconductor surfaces, and the semiconductor material does not grow from the dielectric surfaces. A dopant can be flowed concurrently with the reactant for deposition of the semiconductor material to provide in-situ doping of the deposited semiconductor material. The deposited semiconductor material may be polycrystalline if the underlying semiconductor surfaces are polycrystalline or amorphous, or single crystalline (epitaxial) or polycrystalline if the underlying semiconductor surfaces are single crystalline.

The doped semiconductor material can grow directly from the physically exposed outer sidewall surfaces of the semiconductor channels (i.e., vertical channels) 60, the physically exposed surfaces of the source semiconductor layer 112, and the physically exposed surfaces of the cap semiconductor layer 116. The doped semiconductor material can have a doping of the first conductivity type, i.e., the same conductivity type as the conductivity type of the source semiconductor layer 112. For example, if the source semiconductor layer 112 includes an n-doped semiconductor material, the deposited doped semiconductor material is also n-doped.

Semiconductor material portions including the deposited doped semiconductor material grow around each memory opening fill structure 58 at the level of the source cavity 119. The portions of the doped semiconductor material that grow from each physically exposed surface of the source semiconductor layer 112 or the cap semiconductor layer 116 merge with a doped semiconductor material portion that grows from the most proximal semiconductor channel 60, i.e., the semiconductor channel 60 that is surrounded by the portions of the doped semiconductor material. Thus, a single cylindrical portion of the deposited semiconductor material is formed directly on each semiconductor channel 60. The selective semiconductor deposition process proceeds until the deposited semiconductor material portions that are grown from different semiconductor channels 60 merge to form a single continuous doped semiconductor layer, which is the source strap layer 38. The source strap layer 38 laterally surrounds, and contacts, each of the semiconductor channels 60. The selective semiconductor deposition process that grows the doped semiconductor material from semiconductor surfaces and not from dielectric surfaces forms the source strap layer 38. The source strap layer 38 can fill the source cavity 119. The source strap layer 38 provides electrically conductive paths between the source semiconductor layer 112 and bottom sidewall portions of the semiconductor channels 60.

In one embodiment, the source strap layer 38 can contact a tapered bottom surface of each metal oxide blocking dielectric 51 that passes through the alternating stack (32, 42), a tapered bottom surface of each silicon oxide blocking dielectric 52 that passes through the alternating stack (32, 42), a tapered bottom surface of each charge trapping layer 54 that passes through the alternating stack (32, 42), and a tapered bottom surface of each tunneling dielectric layer 56 that passes through the alternating stack (32, 42). In one embodiment, the entire surface of each semiconductor channel 60 between a bottom periphery of the memory film 50 and a top periphery of the dielectric material cap portion 150 can directly contact the source strap layer 38. Each memory stack structure (50, 60) includes a memory film 50 vertically extending through the alternating stack (32, 42) and terminating above a top surface of the source strap layer 38, and a semiconductor channel 60 laterally surrounded by the memory film 50, extending into an upper portion of the source semiconductor layer 112, and contacting the source strap layer 38.

Figure 13:
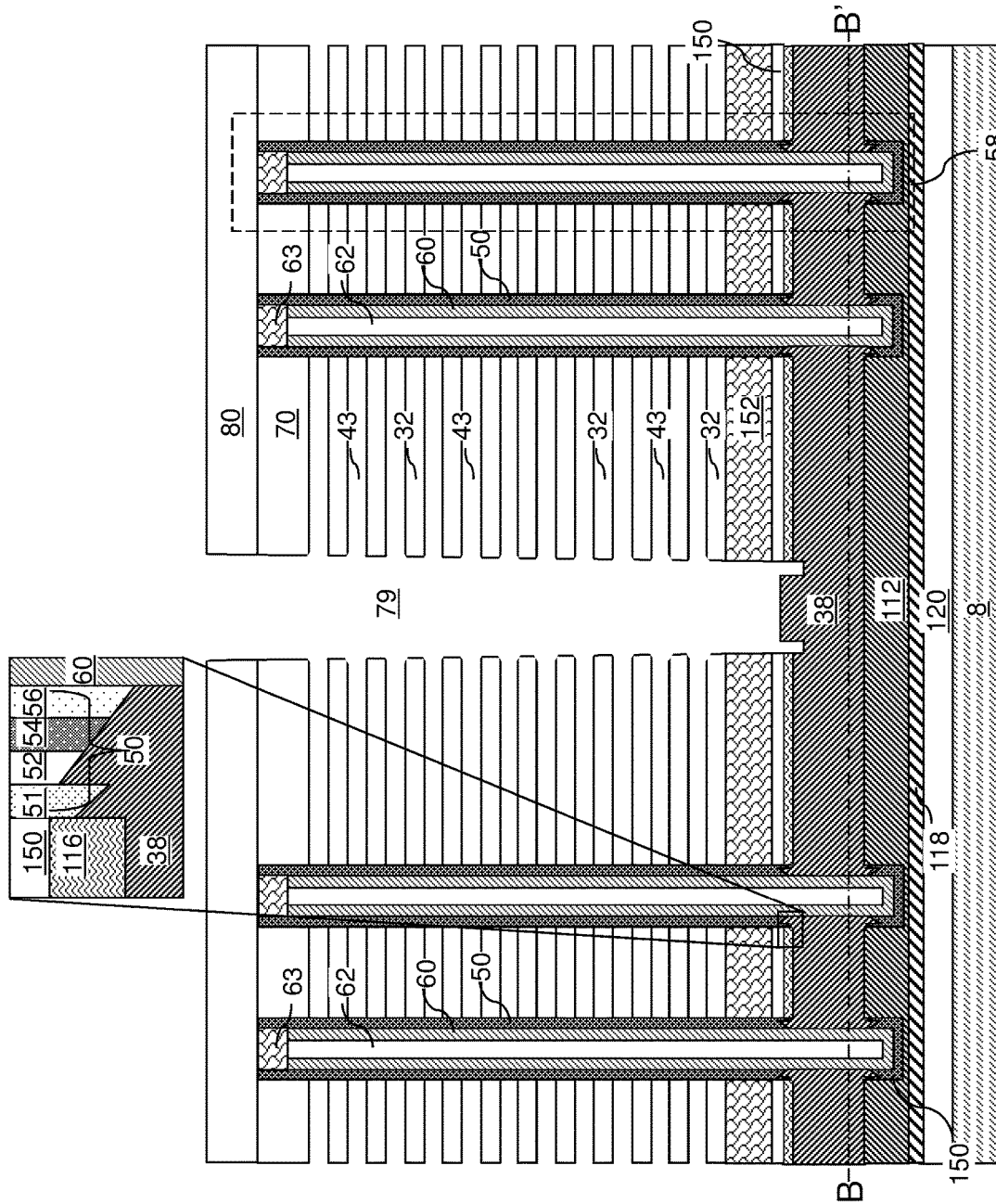
FIG. 13 is a vertical cross-sectional view of the exemplary structure after formation of backside recesses according to an embodiment of the present disclosure.

Referring to FIG. 13, the trench spacer 174 and the sacrificial material layers 32 are removed selective to the insulating layers 32, the insulating cap layer 70, the contact level dielectric layer 80, and the dielectric fill material layer 22. For example, an etchant that selectively etches the second material of the sacrificial material layers 42 with respect to the first material of the insulating layers 32 can be introduced into the backside trenches 79 employing an isotropic etch process such as a wet etch process. If the trench spacer 174 includes the same material as the sacrificial material layers 42, the trench spacer 174 can be removed in the same etch process as the etch process employed to remove the sacrificial material layers 42. If the trench spacer 174 includes a different material than the sacrificial material layers 42, the trench spacer 174 may be removed by an isotropic etch prior to removal of the sacrificial material layers 42. In an illustrative example, if the trench spacer 174 and the sacrificial material layers 42 include silicon nitride, a wet etch employing hot phosphoric acid can be employed to remove the trench spacer 174 and the sacrificial material layers 42.

Backside recesses 43 are formed in volumes from which the sacrificial material layers 42 are removed. The removal of the second material of the sacrificial material layers 42 can be selective to the first material of the insulating layers 32, the material of retro-stepped dielectric material portion 65, the material of the outermost layer of the memory films 50 (e.g., the material of the metal oxide blocking dielectrics 51), and the semiconductor materials of the doped semiconductor layer 152 and the cap semiconductor layer 116. In one embodiment, the sacrificial material layers 42 can include silicon nitride, and the materials of the insulating layers 32 and the retro-stepped dielectric material portion 65 can include silicon oxide materials.

The etch process that removes the second material selective to the first material and the outermost layers of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The memory opening fill structures 58 in the memory array region 100, the support pillar structure provided in the contact region 300, and the retro-stepped dielectric material portion 65 can provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory opening fill structures 58 are formed are herein referred to as front side openings or front side cavities in contrast with the backside recesses 43. In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings. Each of the plurality of backside recesses 43 can extend substantially parallel to the top surface of the substrate 8. A backside recess 43 can be vertically bounded by a top surface of an underlying insulating layer 32 and a bottom surface of an overlying insulating layer 32. In one embodiment, each backside recess 43 can have a uniform height throughout.

Figure 14:
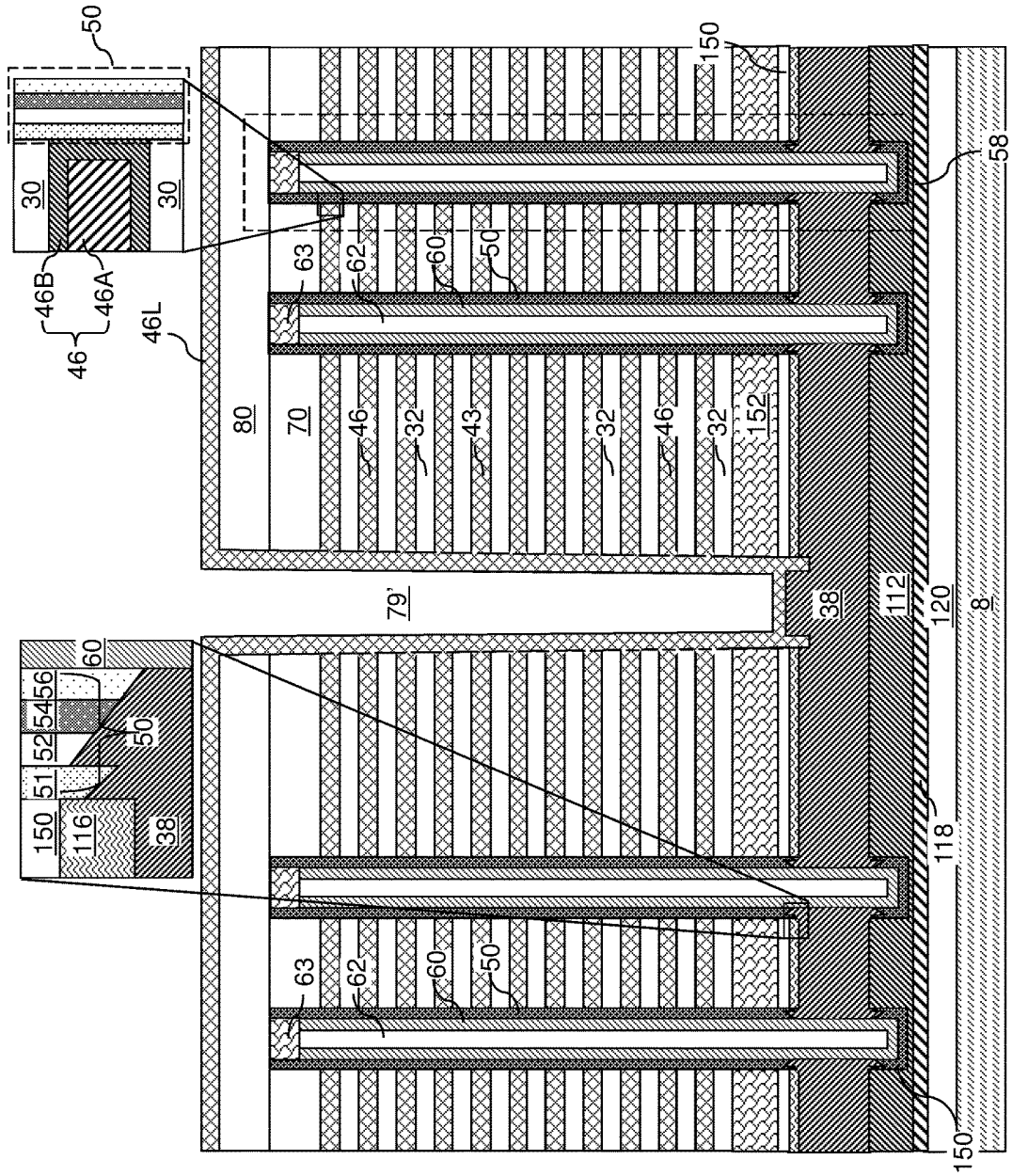
FIG. 14 is a vertical cross-sectional view of the exemplary structure after deposition of at least one conductive material to form electrically conductive layers and a continuous metallic material layer according to an embodiment of the present disclosure.

Referring to FIG. 14, at least one metallic material can be subsequently deposited in the backside recesses 43 and the backside trenches 79. For example, a combination of a metallic barrier layer 46A (which may include a conductive metallic nitride material such as TiN, TaN, WN, or a stack thereof) and at least one metal fill material layer 46B (such as a tungsten layer) can be deposited by conformal deposition processes such as chemical vapor deposition (CVD) or atomic layer deposition (ALD). A plurality of electrically conductive layers 46 can be formed in the plurality of backside recesses 43, and a continuous metallic material layer 46L can be formed on the sidewalls of each backside trench 79 and over the contact level dielectric layer 80. Each electrically conductive layer 46 includes a portion of the metallic barrier layer and a metallic fill material portion. Thus, each sacrificial material layer 42 can be replaced with an electrically conductive layer 46. A backside cavity 79' is present in the portion of each backside trench 79 that is not filled with the continuous metallic material layer 46L.

Figure 15:
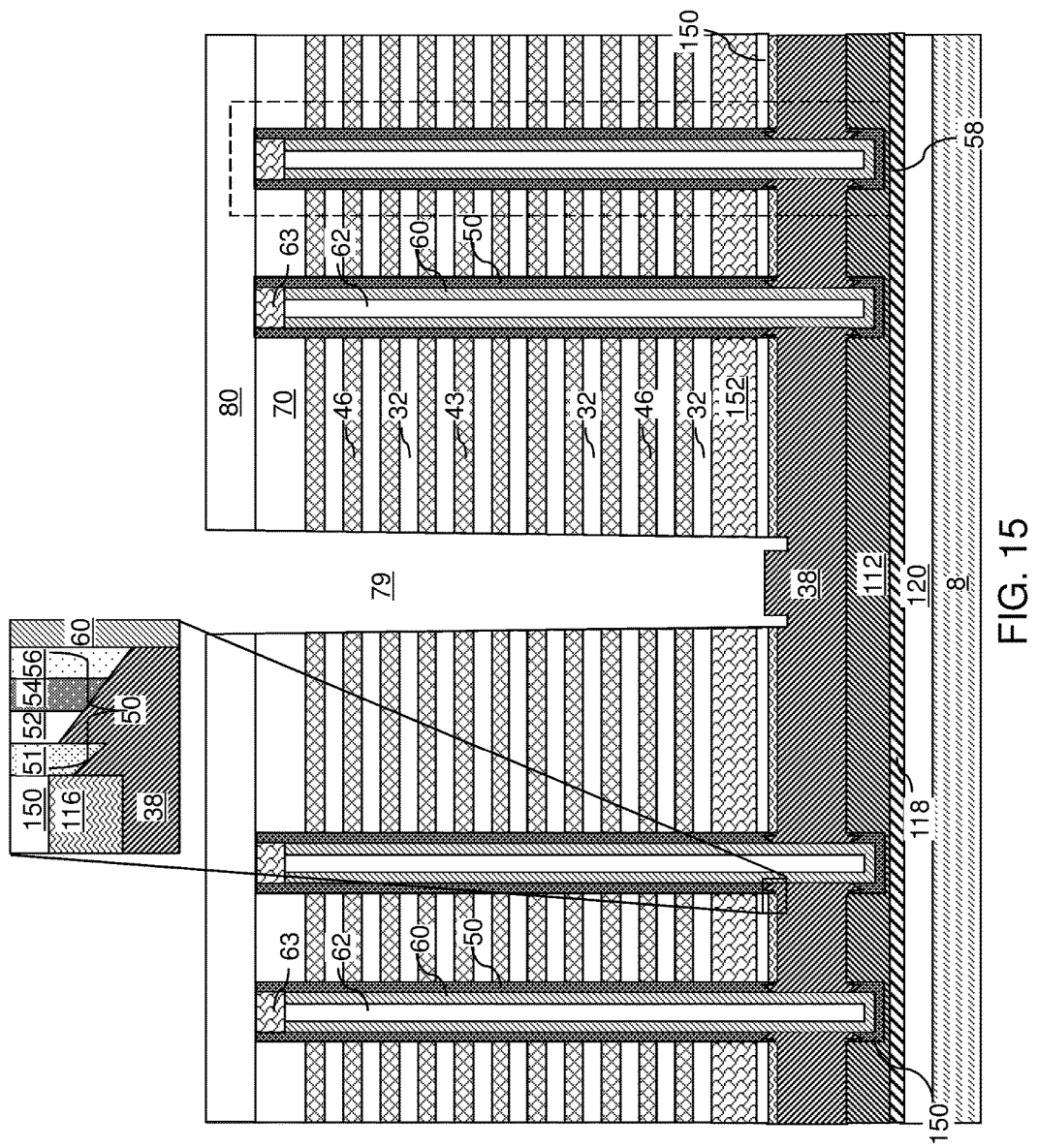
FIG. 15 is a vertical cross-sectional view of the exemplary structure after removal of the deposited at least one conductive material from inside the backside trench according to an embodiment of the present disclosure.

Referring to FIG. 15, the deposited metallic material of the continuous electrically conductive material layer 46L is etched back from the sidewalls of each backside trench 79 and from above the contact level dielectric layer 80, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 can include the control gate electrodes for the vertical memory devices including the memory opening fill structures 58. In other words, each electrically conductive layer 46 can be a word line that functions as a common control gate electrode for the plurality of vertical memory devices.

Figure 16B:
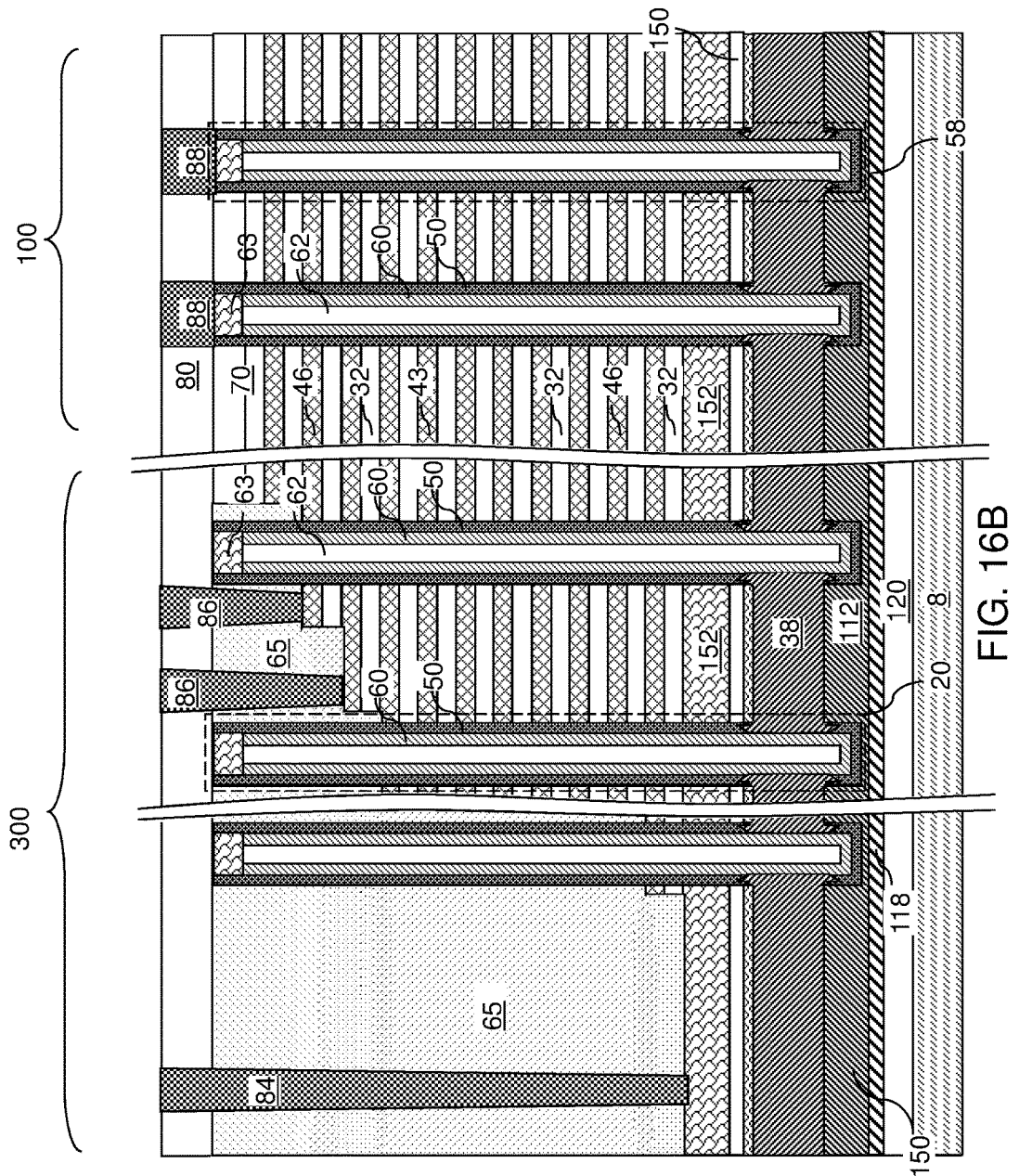
FIG. 16B is a vertical cross-sectional view of a region straddling the memory array region and the contact region of the exemplary structure after the processing steps of FIG. 16A.
Figure 16C:
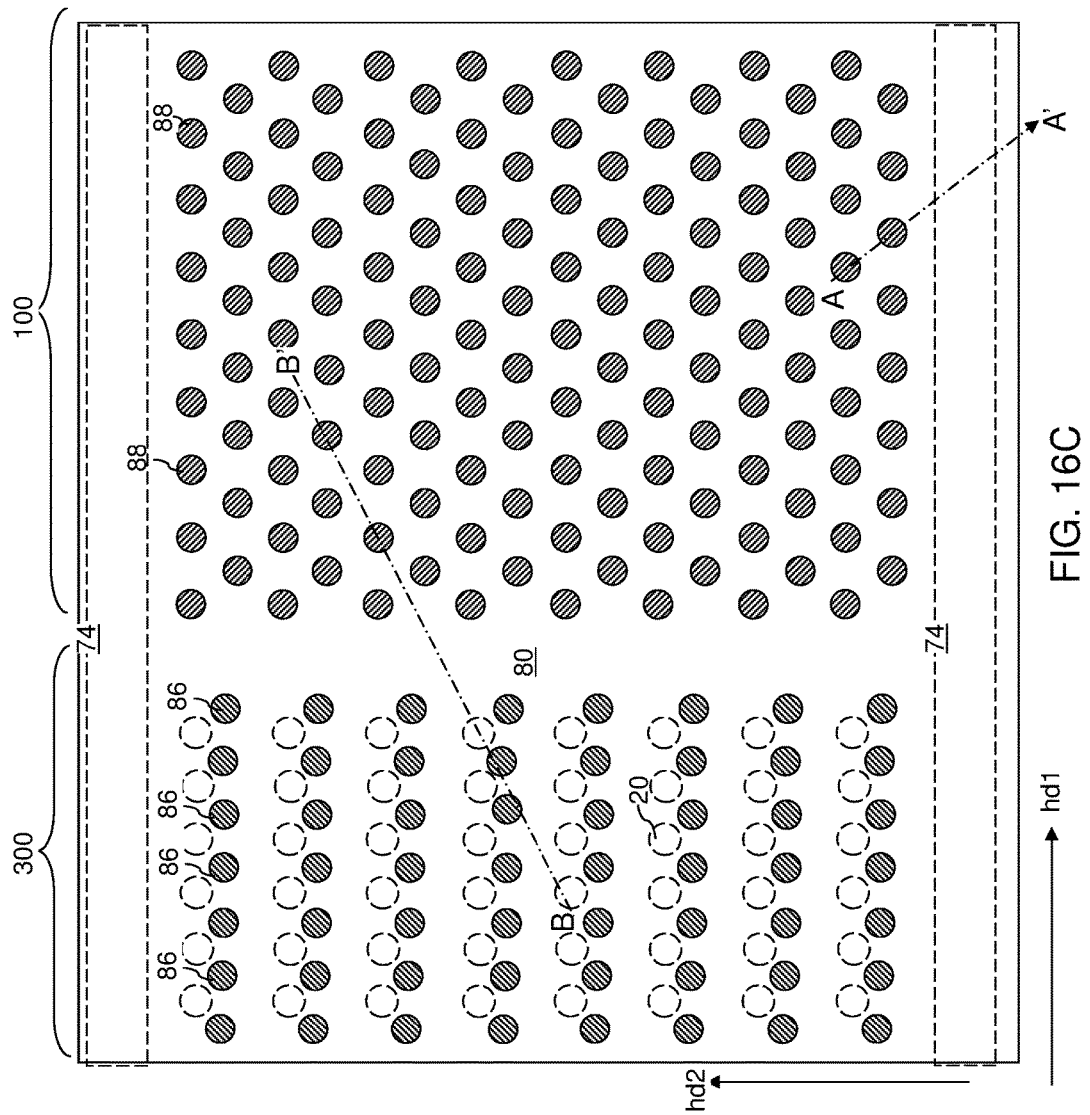
FIG. 16C is a top-down view of the exemplary structure of FIGS. 16A and 16B. The vertical plane A-A' is a portion of the plane of the vertical cross-section of FIG. 16A. The vertical plane B-B' is the plane of the vertical cross-section of FIG. 16B.

Referring to FIGS. 16A-16C, an insulating material (such as silicon oxide) can be deposited in the backside cavities 79' to form a dielectric wall structure 76 in each backside trench 79. Excess portions of the insulating material overlying the contact level dielectric layer 80 may, or may not, be removed. Each dielectric wall structure 76 is a dielectric material structure vertically extending through the alternating stack (32, 46) and laterally extending along a first horizontal direction hd1, and laterally spaced apart from other dielectric material structures along the second horizontal direction hd2. Each dielectric wall structure 76 contacts sidewalls of the insulating layers 32 and the electrically conductive layers 46 and top surfaces of the source strap layer 38. In one embodiment, a bottom peripheral portion of each dielectric material structure (such as the dielectric wall structures 76) can protrude into an upper surface of the source strap layer 38.

Contact via structures (88, 86) can be formed through the contact level dielectric layer 80, and through the retro-stepped dielectric material portions 65. For example, drain contact via structures 88 can be formed through the contact level dielectric layer 80 on each drain region 63. Word line contact via structures 86 can be formed on the electrically conductive layers 46 through the contact level dielectric layer 80, and through the retro-stepped dielectric material portions 65. Additionally, peripheral device contact via structures (not shown) can be formed through the retro-stepped dielectric material portions 65 on respective nodes of the peripheral devices directly and/or through the various lower level metal interconnect structures within the at least one lower level dielectric layer 120. Support pillar structures 20 can be interspersed among the word line contact via structures 86, as shown in FIG. 16B.

The exemplary structure of the present disclosure can include a three-dimensional memory device. The three-dimensional memory device includes a source strap layer 38 located over a substrate 8, an alternating stack (32, 46) of electrically conductive layers 46 and insulating layers 32 located over the source strap layer 38; and a memory stack structure (50, 60) that extends through the alternating stack (32, 46) and the source strap layer 38. The memory stack structure (50, 60) includes a memory film 50 vertically extending through the alternating stack (32, 46) and terminating above a top surface of the source strap layer 38, and a semiconductor channel 60 laterally surrounded by the memory film 50, and contacting the source strap layer 38. The memory film 50 comprises a metal oxide blocking dielectric 51 that directly contacts each layer within the alternating stack (32, 46).

In one embodiment, the device may also include a source semiconductor layer 112 comprising a first doped semiconductor material located over a substrate 8. The source strap layer 38 may comprise a second doped semiconductor material of a same conductivity type as the first doped semiconductor material, overlying and extending into an upper portion of the source semiconductor layer 112. In one embodiment, the memory film 50 further comprises: a silicon oxide blocking dielectric 52 contacting an inner sidewall of the metal oxide blocking dielectric 51; a charge trapping layer 54 contacting an inner sidewall of the silicon oxide blocking dielectric 52; and a tunneling dielectric layer 56 contacting an inner sidewall of the charge trapping layer 54. In one embodiment, the metal oxide blocking dielectric 51 comprises aluminum oxide which vertically protrudes further downward than the silicon oxide blocking dielectric 52. In one embodiment, the inner sidewall of the metal oxide blocking dielectric 51 vertically extends farther downward than an outer sidewall of the metal oxide blocking dielectric 51. In one embodiment, the source strap layer 38 contacts a tapered bottom surface of the metal oxide blocking dielectric 51, a tapered bottom surface of the silicon oxide blocking dielectric 52, a tapered bottom surface of the charge trapping layer 54, and a tapered bottom surface of the tunneling dielectric layer 56.

In one embodiment, a bottom periphery of an interface between the silicon oxide blocking dielectric 52 and the metal oxide blocking dielectric 51 is located above a bottom periphery of the inner sidewall of the metal oxide blocking dielectric 51. The three-dimensional memory device can further comprise a dielectric material cap portion 150 that underlies, and contacts, the semiconductor channel 60, is embedded within the source semiconductor layer 112, and comprising a same layer stack of dielectric materials as the memory film 50. In one embodiment, the entire surface of the semiconductor channel 60 between a bottom periphery of the memory film 50 and a top periphery of the dielectric material cap portion 150 directly contacts the source strap layer 38. In one embodiment, the three-dimensional memory device can further comprise a backside trench 79 vertically extending through the alternating stack (32, 46) and including a dielectric material structure (such as a dielectric wall structure 76) therein, wherein a bottom peripheral portion of the dielectric material structures protrudes into an upper surface of the source strap layer 38.

The doped semiconductor layer 152 can be employed as a source select electrode that activates a selected set of semiconductor channels 60. In this case, the three-dimensional memory device can include a source select electrode that is embodied as the doped semiconductor layer 152, located between the alternating stack (32, 46) and the source strap layer 38, and laterally surrounding each of the memory stack structures (50, 60).

Each of the exemplary structures of the present disclosure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate 8 can comprise a silicon substrate. The vertical NAND memory device can comprise an array of monolithic three-dimensional NAND strings over the silicon substrate. At least one memory cell (containing a portion of a charge storage layer 54 at a level of an electrically conductive layer 46) in a first device level of the array of monolithic three-dimensional NAND strings can be located over another memory cell (containing another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. For example, the semiconductor devices 210 (expressly illustrated in FIG. 1) can be employed as the integrated circuit including the driver circuit. The electrically conductive layers 46 can comprise a plurality of control gate electrodes having a strip shape extending substantially parallel to the top surface of the substrate 8, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion of each of the plurality of semiconductor channels 60 extends substantially perpendicular to a top surface of the substrate 8; and a plurality of charge storage elements (as embodied as charge trapping material portions). Each charge storage element can be located adjacent to a respective one of the plurality of semiconductor channels 60.

The exemplary structure of the present disclosure provides electrical connection between the source semiconductor layer 112 and the semiconductor channels 60 by forming the source strap layer 38. In other words, the source strap layer 38 and the source semiconductor layer 112 together form a source region and a horizontal source line. Formation of a backside blocking dielectric layer in the backside recesses 43 prior to deposition of at least one conductive material for forming the electrically conductive layers 46 is not necessary because the metal oxide blocking dielectrics 51 in the memory opening 49 can provide the function of the backside blocking dielectric layer. Specifically, each combination of a metal oxide blocking dielectric 51 and a silicon oxide blocking dielectric 52 can provide sufficient electrical isolation between the charge trapping layers 54 and the electrically conductive layers 46. The entire volume of the backside recesses 43 can be employed to form electrically conductive layers 46 therein, which allows formation of lower resistivity electrically conductive layers 46 as word lines and reduction of the RC delay for the word lines and enhancement of the operational speed of the three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising: a source strap layer located over a substrate; an alternating stack of electrically conductive layers and insulating layers located over the source strap layer; and a memory stack structure that extends through the alternating stack and the source strap layer, wherein: the memory stack structure comprises a memory film vertically extending through the alternating stack and terminating above a top surface of the source strap layer, and a semiconductor channel laterally surrounded by the memory film, and contacting the source strap layer; and the memory film comprises a metal oxide blocking dielectric that directly contacts each layer within the alternating stack, wherein the memory film further comprises: a silicon oxide blocking dielectric contacting an inner sidewall of the metal oxide blocking dielectric; a charge trapping layer contacting an inner sidewall of the silicon oxide blocking dielectric; and a tunneling dielectric layer contacting an inner sidewall of the charge trapping layer, wherein the metal oxide blocking dielectric comprises aluminum oxide, wherein: the metal oxide blocking dielectric vertically protrudes further downward than the silicon oxide blocking dielectric; and the inner sidewall of the metal oxide blocking dielectric vertically extends farther downward than an outer sidewall of the metal oxide blocking dielectric.

2. The three-dimensional memory device of claim 1, wherein the source strap layer contacts a tapered bottom surface of the metal oxide blocking dielectric, a tapered bottom surface of the silicon oxide blocking dielectric, a tapered bottom surface of the charge trapping layer, and a tapered bottom surface of the tunneling dielectric layer.

3. The three-dimensional memory device of claim 1, wherein a bottom periphery of an interface between the silicon oxide blocking dielectric and the metal oxide blocking dielectric is located above a bottom periphery of the inner sidewall of the metal oxide blocking dielectric.

4. The three-dimensional memory device of claim 1, further comprising:
    a source semiconductor layer comprising a first doped semiconductor material located over a substrate, wherein the source strap layer comprises a second doped semiconductor material of a same conductivity type as the first doped semiconductor material, overlying and extending into an upper portion of the source semiconductor layer; and
    a dielectric material cap portion that underlies, and contacts, the semiconductor channel, is embedded within the source semiconductor layer, and comprising a same layer stack of dielectric materials as the memory film.

5. The three-dimensional memory device of claim 4, wherein an entire surface of the semiconductor channel between a bottom periphery of the memory film and a top periphery of the dielectric material cap portion directly contacts the source strap layer.

6. The three-dimensional memory device of claim 1, further comprising a backside trench vertically extending through the alternating stack and including a dielectric material structure therein, wherein a bottom peripheral portion of the dielectric material structure protrudes into an upper surface of the source strap layer.

7. The three-dimensional memory device of claim 1, wherein:
    the three-dimensional memory device comprises a monolithic three-dimensional NAND memory device;
    the electrically conductive layers comprise, or are electrically connected to, a respective word line of the monolithic three-dimensional NAND memory device;
    the substrate comprises a silicon substrate;
    the monolithic three-dimensional NAND memory device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon;
    the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:
- a plurality of semiconductor channels, wherein at least one end portion of each of the plurality of semiconductor channels extends substantially perpendicular to a top surface of the substrate, and
- a plurality of charge storage elements, each charge storage element located adjacent to a respective one of the plurality of semiconductor channels.

* * * * *